(12) United States Patent
Sakakura et al.

(10) Patent No.: US 9,780,222 B2
(45) Date of Patent: Oct. 3, 2017

(54) SEMICONDUCTOR DEVICE

(71) Applicant: SEMICONDUCTOR ENERGY LABORATORY CO., LTD., Atsugi-shi, Kanagawa-ken (JP)

(72) Inventors: Masayuki Sakakura, Tochigi (JP); Shunpei Yamazaki, Tokyo (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 14/814,597

(22) Filed: Jul. 31, 2015

(65) Prior Publication Data

US 2015/0380564 A1 Dec. 31, 2015

Related U.S. Application Data

(63) Continuation of application No. 13/366,933, filed on Feb. 6, 2012, now Pat. No. 9,099,395, which is a (Continued)

(30) Foreign Application Priority Data

Jul. 22, 2005 (JP) .................................. 2005-212200

(51) Int. Cl.
H01L 21/00 (2006.01)
H01L 29/786 (2006.01)
(Continued)

(52) U.S. Cl.
CPC ........ *H01L 29/78645* (2013.01); *H01L 27/12* (2013.01); *H01L 27/124* (2013.01);
(Continued)

(58) Field of Classification Search
CPC .. H01L 29/78645; H01L 27/124; H01L 27/12
See application file for complete search history.

(56) References Cited

U.S. PATENT DOCUMENTS 5,181,132 A 1/1993 Shindo et al.
5,847,432 A * 12/1998 Nozaki ............ H01L 21/82380
257/369
(Continued)

FOREIGN PATENT DOCUMENTS

CN 001366341 A 8/2002
CN 001429054 A 7/2003
(Continued)

OTHER PUBLICATIONS

International Search Report (Application No. PCT/JP2006/314824) Dated Oct. 31, 2006.
(Continued)

*Primary Examiner* — Laura Menz
(74) *Attorney, Agent, or Firm* — Nixon Peabody LLP; Jeffrey L. Costellia

(57) ABSTRACT

It is an object to provide a transistor having a new multigate structure in which operating characteristics and reliability are improved. In a transistor having a multigate structure, which includes two gate electrodes electrically connected to each other and a semiconductor layer including two channel regions connected in series formed between a source region and a drain region, and a high concentration impurity region is formed between the two channel regions; the channel length of the channel region adjacent to the source region is longer than the channel length of the channel region adjacent to the drain region.

21 Claims, 20 Drawing Sheets

Related U.S. Application Data continuation of application No. 11/995,224, filed as application No. PCT/JP2006/314824 on Jul. 20, 2006, now Pat. No. 8,115,206.

(51) Int. Cl.
  *H01L 27/12* (2006.01)
  *H01L 27/28* (2006.01)
  *H01L 29/423* (2006.01)

(52) U.S. Cl.
  CPC ...... *H01L 27/283* (2013.01); *H01L 29/42384* (2013.01); *H01L 29/78696* (2013.01)

(56) References Cited

U.S. PATENT DOCUMENTS

| | | | |
|---|---|---|---|
| 5,982,471 A | 11/1999 | Hirakata et al. | |
| 6,077,736 A * | 6/2000 | Hwang | H01L 21/82345 257/E21.624 |
| 6,177,974 B1 | 1/2001 | Hirakata et al. | |
| 6,184,559 B1 | 2/2001 | Hayakawa et al. | |
| 6,396,078 B1 | 5/2002 | Uochi et al. | |
| 6,404,480 B2 | 6/2002 | Hirakata et al. | |
| 6,420,834 B2 * | 7/2002 | Yamazaki | H01L 27/3246 313/238 |
| 6,426,517 B2 | 7/2002 | Hayakawa et al. | |
| 6,492,778 B1 | 12/2002 | Segawa | |
| 6,512,504 B1 | 1/2003 | Yamauchi et al. | |
| 6,521,912 B1 | 2/2003 | Sakama et al. | |
| 6,593,235 B2 | 7/2003 | Uochi et al. | |
| 6,599,788 B1 | 7/2003 | Kawasaki et al. | |
| 6,646,284 B2 * | 11/2003 | Yamazaki | H01L 27/3246 257/40 |
| 6,661,180 B2 | 12/2003 | Koyama | |
| 6,674,244 B2 | 1/2004 | Segawa | |
| 6,699,739 B2 | 3/2004 | Yamazaki et al. | |
| 6,713,323 B2 * | 3/2004 | Yamazaki | H01L 27/12 257/E21.413 |
| 6,756,608 B2 * | 6/2004 | Kasahara | H01L 21/02532 257/65 |
| 6,822,264 B2 | 11/2004 | Yamazaki et al. | |
| 6,844,672 B2 | 1/2005 | Yamazaki | |
| 6,858,480 B2 | 2/2005 | Nakamura et al. | |
| 6,864,508 B2 * | 3/2005 | Yamazaki | H01L 21/3226 257/100 |
| 6,894,432 B2 | 5/2005 | Fujieda et al. | |
| 6,913,956 B2 | 7/2005 | Hamada et al. | |
| 6,919,282 B2 | 7/2005 | Sakama et al. | |
| 6,952,023 B2 * | 10/2005 | Yamazaki | H01L 21/3226 257/100 |
| 6,954,194 B2 | 10/2005 | Matsumoto et al. | |
| 7,009,339 B2 | 3/2006 | Lee et al. | |
| 7,033,871 B2 | 4/2006 | Nakamura et al. | |
| 7,122,409 B2 | 10/2006 | Kawasaki et al. | |
| 7,151,016 B2 | 12/2006 | Kajiwara et al. | |
| 7,166,899 B2 | 1/2007 | Sakama et al. | |
| 7,198,992 B2 | 4/2007 | Hamada et al. | |
| 7,205,565 B2 | 4/2007 | Im et al. | |
| 7,208,235 B2 | 4/2007 | Otani et al. | |
| 7,211,838 B2 | 5/2007 | Miyazawa | |
| 7,256,421 B2 | 8/2007 | Yamazaki et al. | |
| 7,265,390 B2 * | 9/2007 | Yamazaki | H01L 21/3226 257/103 |
| 7,274,039 B2 | 9/2007 | Park | |
| 7,294,924 B2 | 11/2007 | Kim | |
| 7,365,494 B2 * | 4/2008 | Sato | H01L 27/156 257/72 |
| 7,372,114 B2 | 5/2008 | Sakama et al. | |
| 7,443,478 B2 | 10/2008 | Hirakata et al. | |
| 7,465,677 B2 | 12/2008 | Isobe et al. | |
| 7,485,896 B2 * | 2/2009 | Yamazaki | H01L 21/3226 257/79 |
| 7,501,671 B2 | 3/2009 | Hamada et al. | |
| 7,501,756 B2 | 3/2009 | Kim et al. | |
| 7,561,242 B2 | 7/2009 | Hirakata et al. | |
| 7,564,058 B2 * | 7/2009 | Yamazaki | G02F 1/1368 257/72 |
| 7,579,270 B2 | 8/2009 | Sato et al. | |
| 7,598,111 B2 | 10/2009 | Im et al. | |
| 7,605,029 B2 | 10/2009 | Nakamura et al. | |
| 7,616,273 B2 | 11/2009 | Hirakata et al. | |
| 7,652,289 B2 | 1/2010 | Koyama | |
| 7,656,087 B2 | 2/2010 | Kim et al. | |
| 7,696,689 B2 | 4/2010 | Lee et al. | |
| 7,697,102 B2 | 4/2010 | Hirakata et al. | |
| 7,705,534 B2 | 4/2010 | Lee et al. | |
| 7,709,368 B2 * | 5/2010 | Sasagawa | H01L 21/76804 438/618 |
| 7,709,894 B2 | 5/2010 | Kajiwara et al. | |
| 7,714,328 B2 | 5/2010 | Miyazawa | |
| 7,718,547 B2 | 5/2010 | Isobe et al. | |
| 7,723,205 B2 * | 5/2010 | Kakehata | C23C 8/36 257/E21.475 |
| 7,760,316 B2 | 7/2010 | Hirakata et al. | |
| 7,902,034 B2 * | 3/2011 | Yamazaki | H01L 21/76254 257/E21.002 |
| 7,936,125 B2 | 5/2011 | Kim et al. | |
| 7,969,012 B2 * | 6/2011 | Sasagawa | H01L 21/76804 257/773 |
| 8,115,206 B2 * | 2/2012 | Sakakura | H01L 27/12 257/66 |
| 8,120,031 B2 | 2/2012 | Yamazaki et al. | |
| 8,142,839 B2 | 3/2012 | Lee et al. | |
| 8,153,184 B2 | 4/2012 | Lee et al. | |
| 8,581,413 B2 * | 11/2013 | Sasagawa | H01L 21/76804 257/773 |
| 2002/0053674 A1 * | 5/2002 | Nakajima | H01L 27/1214 257/72 |
| 2002/0098628 A1 | 7/2002 | Hamada et al. | |
| 2003/0054653 A1 * | 3/2003 | Yamazaki | H01L 23/5283 438/694 |
| 2003/0057862 A1 | 3/2003 | Segawa | |
| 2003/0155860 A1 | 8/2003 | Choi et al. | |
| 2003/0160247 A1 | 8/2003 | Miyazawa | |
| 2004/0007748 A1 | 1/2004 | Sakama et al. | |
| 2004/0195590 A1 * | 10/2004 | Suzawa | H01L 21/32136 257/200 |
| 2005/0110011 A1 | 5/2005 | Im et al. | |
| 2005/0116630 A1 | 6/2005 | Kim et al. | |
| 2005/0116631 A1 | 6/2005 | Kim et al. | |
| 2005/0253531 A1 | 11/2005 | Matsumoto et al. | |
| 2005/0258423 A1 * | 11/2005 | Kuwabara | H01L 27/1214 257/66 |
| 2005/0263835 A1 | 12/2005 | Sakama et al. | |
| 2006/0006417 A1 | 1/2006 | Kim et al. | |
| 2006/0255345 A1 * | 11/2006 | Sakakura | H01L 27/3223 257/88 |
| 2007/0001225 A1 * | 1/2007 | Ohnuma | H01L 27/1214 257/347 |
| 2007/0029626 A1 | 2/2007 | Sakama et al. | |
| 2008/0237876 A1 * | 10/2008 | Sasagawa | H01L 21/76804 257/773 |
| 2008/0268583 A1 * | 10/2008 | Yamazaki | H01L 21/76254 438/151 |
| 2009/0050890 A1 | 2/2009 | Hirakata et al. | |
| 2009/0061569 A1 | 3/2009 | Hirakata et al. | |
| 2009/0261337 A1 * | 10/2009 | Sakakura | H01L 27/12 257/72 |
| 2010/0176461 A1 * | 7/2010 | Sasagawa | H01L 21/76804 257/412 |
| 2011/0012113 A1 * | 1/2011 | Ohnuma | H01L 27/1214 257/57 |
| 2011/0084267 A1 * | 4/2011 | Yamazaki | H01L 21/76828 257/43 |
| 2011/0084268 A1 * | 4/2011 | Yamazaki | H01L 27/1214 257/43 |

(56) References Cited

U.S. PATENT DOCUMENTS

| | | | |
|---|---|---|---|
| 2012/0132919 A1* | 5/2012 | Sakakura | H01L 27/12 257/66 |
| 2012/0175619 A1 | 7/2012 | Yamazaki et al. | |

FOREIGN PATENT DOCUMENTS

| | | |
|---|---|---|
| CN | 001440224 A | 9/2003 |
| CN | 001622708 A | 6/2005 |
| CN | 001652350 A | 8/2005 |
| DE | 602004025078 | 3/2010 |
| EP | 1315209 A | 5/2003 |
| EP | 1324642 A | 7/2003 |
| EP | 1536465 A | 6/2005 |
| EP | 1536494 A | 6/2005 |
| EP | 1548835 A | 6/2005 |
| EP | 1548838 A | 6/2005 |
| EP | 1919007 A | 5/2008 |
| EP | 1976340 A | 10/2008 |
| JP | 06-317812 A | 11/1994 |
| JP | 09-082969 A | 3/1997 |
| JP | 09-146118 A | 6/1997 |
| JP | 09-251996 A | 9/1997 |
| JP | 10-154816 A | 6/1998 |
| JP | 10-163487 A | 6/1998 |
| JP | 10-268335 A | 10/1998 |
| JP | 11-026776 A | 1/1999 |
| JP | 2000-260571 A | 9/2000 |
| JP | 2000-286422 A | 10/2000 |
| JP | 2001-013893 A | 1/2001 |
| JP | 2002-202737 A | 7/2002 |
| JP | 2002-313722 A | 10/2002 |
| JP | 2002-324808 A | 11/2002 |
| JP | 2003-031587 A | 1/2003 |
| JP | 2003-168569 A | 6/2003 |
| JP | 2003-173154 A | 6/2003 |
| JP | 2003-195775 A | 7/2003 |
| JP | 2003-249370 A | 9/2003 |
| JP | 2004-079509 A | 3/2004 |
| JP | 2004-356660 A | 12/2004 |
| JP | 2005-158292 A | 6/2005 |
| JP | 2005-159284 A | 6/2005 |
| JP | 2005-159368 A | 6/2005 |
| JP | 2005-165324 A | 6/2005 |
| JP | 2005-181973 A | 7/2005 |
| JP | 2005-197256 A | 7/2005 |
| KR | 2003-0069434 A | 8/2003 |
| KR | 2005-0050495 A | 5/2005 |
| KR | 2005-0052301 A | 6/2005 |
| KR | 10-0512047 | 8/2005 |
| TW | 200301456 | 7/2003 |
| TW | 200304100 | 9/2003 |
| TW | 200305218 A | 10/2003 |

OTHER PUBLICATIONS

Written Opinion (Application No. PCT/JP2006/314824) Dated Oct. 31, 2006.

Information Offer Form (Application No. 2012-202525) Dated Dec. 28, 2012.

* cited by examiner

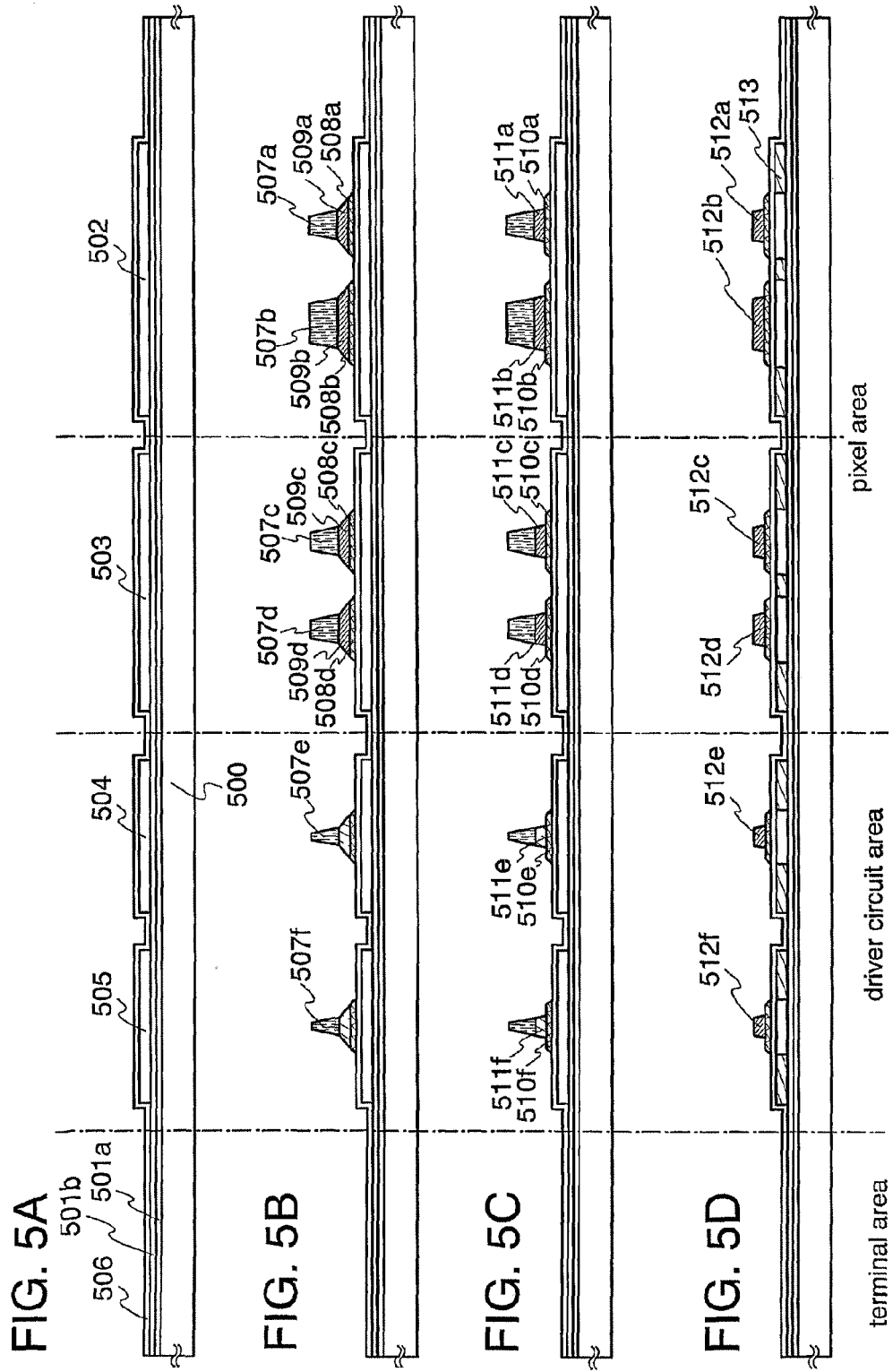

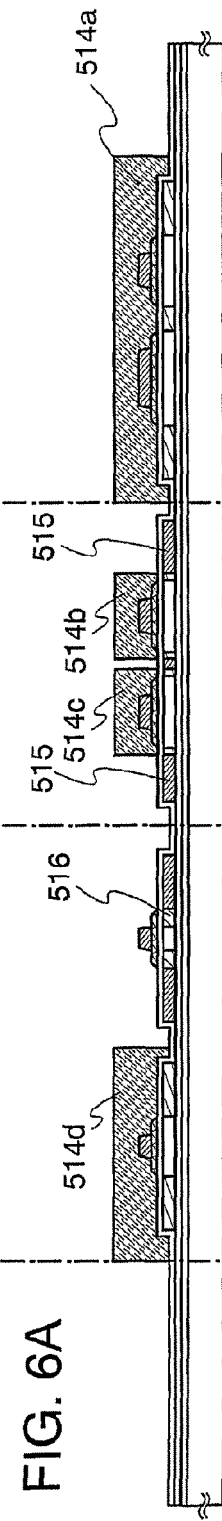
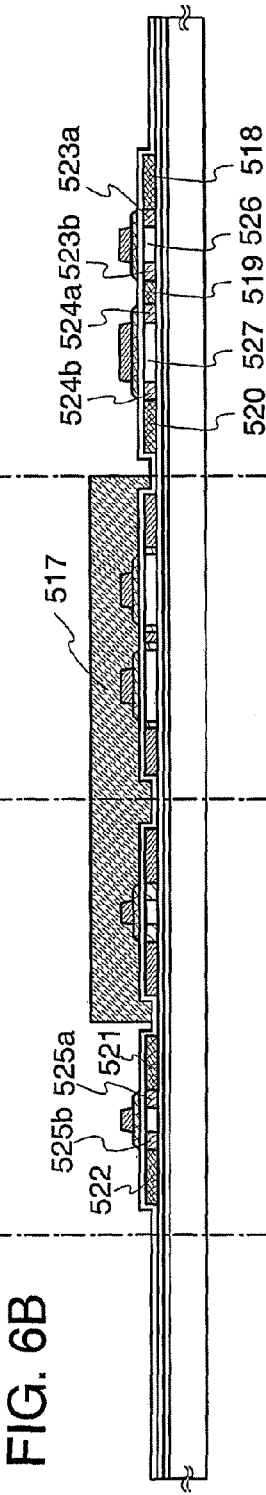
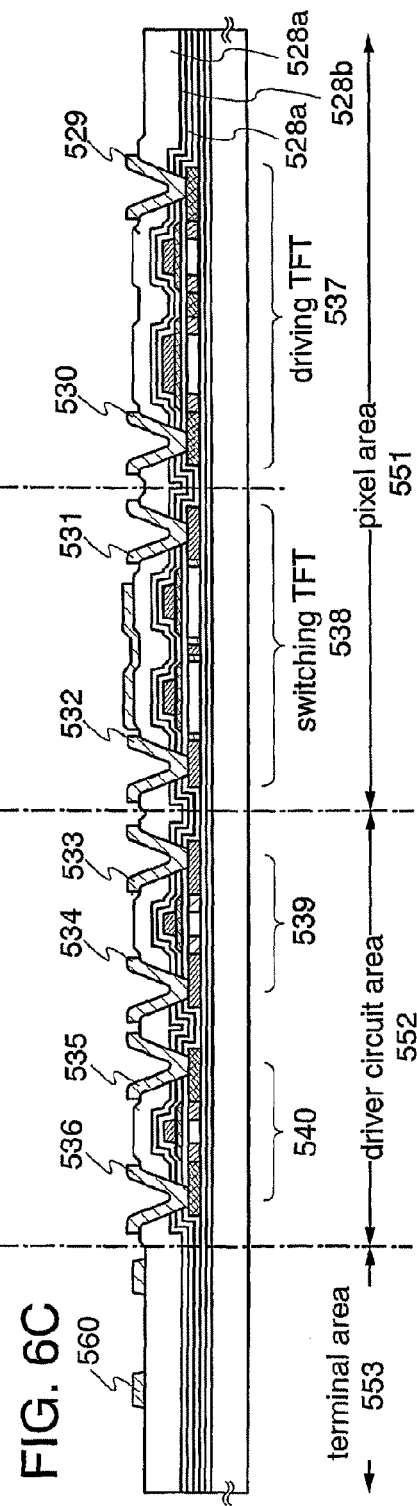
FIG. 6A
FIG. 6B
FIG. 6C

FIG. 17A
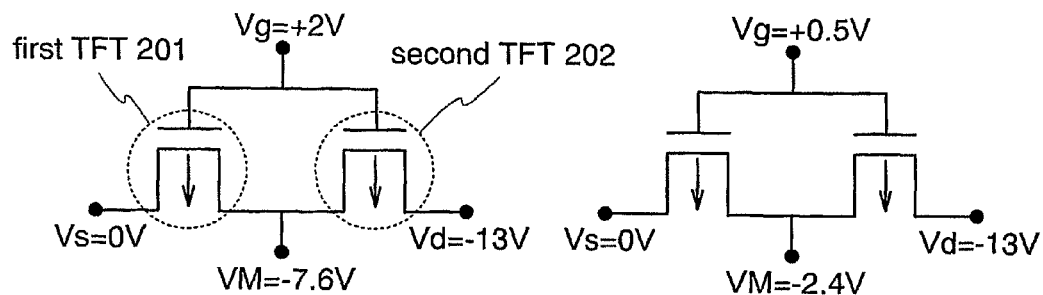
FIG. 17B
FIG. 17C
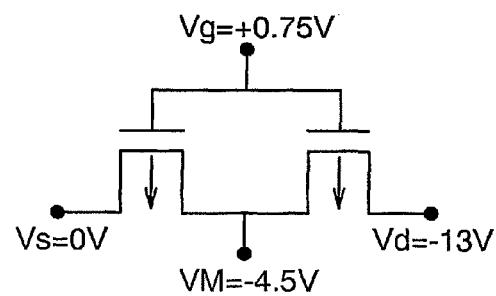
FIG. 17D
FIG. 17E
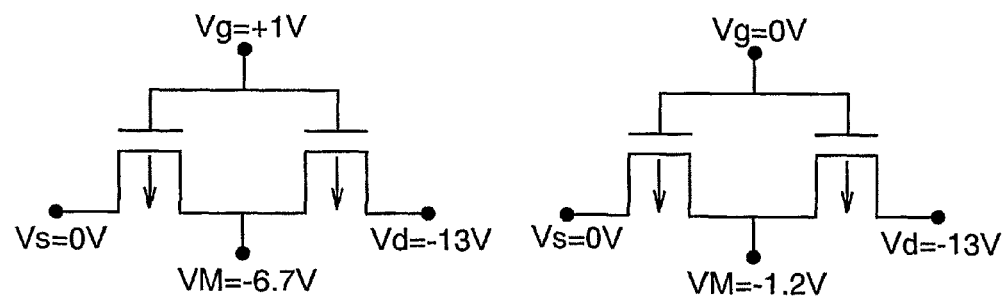

SEMICONDUCTOR DEVICE

TECHNICAL FIELD

The present invention relates to a semiconductor device that has a circuit composed of thin film transistors. For example, the present invention relates to an electronic device equipped with, as a component, a display device having an electro-optical device typified by a liquid crystal display panel or an organic light-emitting display device (EL: Electroluminescent device) that has an organic light-emitting element.

It is to be noted that a semiconductor device in this specification refers to general devices that can operate by utilizing semiconductor properties, and such semiconductor devices include all electro-optical devices, semiconductor circuits, and electronic devices.

BACKGROUND ART

In recent years, a technique of making thin film transistors (TFTs) using a semiconductor thin film (on the order of several to several hundreds nanometers in thickness) formed over a substrate having an insulating surface has been attracting attention. The thin, film transistors are widely applied to electronic devices such as ICs and electro-optical devices, and have been quickly developed in particular as switching elements for image display devices.

In particular, active matrix display devices (such as liquid crystal display devices or light-emitting display devices) in which a switching element of a TFT is provided on each display pixel arranged in matrix, have been actively developed.

In addition, in order to reduce manufacturing costs, developments for forming a driver circuit area and a pixel area on the same substrate have also been advanced. Above all, a TFT using a polysilicon film has higher field-effect mobility than a transistor using an amorphous silicon film, and thus can operate at a higher speed.

In a module that is mounted on the display device, a pixel area that displays images for each function block and a driver circuit for controlling the pixel area, such as a shift register circuit, a level shifter circuit, a buffer circuit, and a sampling circuit, which are CMOS circuits in many cases, are formed over one substrate.

In particular, for a light-emitting display device that has organic light-emitting elements arranged in a matrix, a plurality of transistors having different roles is required for one pixel. In addition, also for a liquid crystal display device, an attempt to form switching transistors and a memory element such as an SRAM in one pixel has been made.

In Reference 1 (Japanese Patent application Laid-Open No. 2001-013893), a transistor that has a multi-gate structure is used in an EL display device.

Generally, current flowing between a source region and a drain region (in a channel region) is controlled by voltage applied to a gate electrode. When the channel length is large enough, in the case where the voltage applied to the gate electrode has a certain value (threshold value) or less, current hardly flows in the channel region. Subsequently, when voltage applied to the gate electrode exceeds the threshold value, current flowing in the channel region increases almost linearly.

As described above, when the channel length is large enough, the threshold is almost constant; however, when the channel length is small, current flows even when voltage of the threshold or less is applied to the gate electrode. This results from reduction of voltage barrier at a boundary between the source region and the channel region due to drain voltage, which is caused as the channel length is shortened. This phenomenon means that as the channel length is shortened, the threshold voltage is reduced, and is known as a typical example of a short channel effect.

When the short channel effect occurs in any channel region of a transistor having a multigate structure, characteristics of the transistor are impaired. In particular, when the short channel effect occurs in a source region adjacent to a source electrode, characteristics of the transistor are impaired.

DISCLOSURE OF INVENTION

The present invention has made in view of such conditions, and it is an object to provide a transistor having a new multigate structure in which operating characteristics and reliability are improved.

Further, the present invention provides a new structure of an active matrix light emitting device which can achieve improvements in reliability.

The present invention aims to prevent characteristic defects of a transistor by controlling the channel lengths of a plurality of channel regions as appropriate.

In accordance with the present invention, in a transistor having a multigate structure (structure including a semiconductor layer having at least two channel regions connected in series, and at least two gate electrodes which applies electric field to each channel regions), of the plurality of channel regions, a channel region adjacent to a source region has a channel length longer than the channel length of a channel adjacent to a drain region.

Further, in the present invention, the channel length of at least a channel region adjacent to a source region is set at a length such that a short channel effect does not occur.

A semiconductor device of the present invention includes a semiconductor layer, two gate electrodes, a source electrode, and a drain electrode over a substrate having an insulating surface. The semiconductor layer includes a source region, a drain region, a first channel region in contact with the source region, a second channel region in contact with the drain region, and a high concentration impurity region placed between the first channel region and the second channel region; the two gate electrodes are separately placed above the first channel region and the second channel region and sandwich a first insulating film between the two gate electrodes and the semiconductor layer, the source electrode and the drain electrode are connected to the semiconductor layer through contact holes formed in the second insulating film; the first channel region and the second channel region are connected in series; and a channel length of the first channel region is larger than a channel length of the second channel region.

A semiconductor device of the present invention includes a semiconductor layer, two gate electrodes, a source electrode, and a drain electrode over a substrate having an insulating surface. The semiconductor layer includes a source region, a drain region, a first channel region in contact with the source region, a second channel region in contact with the drain region, and a high concentration impurity region placed between the first channel region and the second channel region; the two gate electrodes are separately placed above the first channel region and the second channel region and sandwich a first insulating film between the two gate electrodes and the semiconductor layer; the source electrode and the drain electrode are connected to the semiconductor layer through contact holes formed in the second insulating film; the first channel region and the second channel region are connected in series; and the relational expression $L_1 \geq 2 \times L_2$ holds when a channel length of the first channel region is $L_1$ and a channel length of the second channel region is $L_2$.

A semiconductor device of the present invention includes a semiconductor layer, two gate electrodes, a source electrode, and a drain electrode over a substrate having an insulating surface. The semiconductor layer includes a source region, a drain region, a first low concentration impurity region in contact with the source region, a first channel region in contact with the first low concentration impurity region, a second low concentration impurity region in contact with the drain region, a second channel region in contact with the second low concentration impurity region, and a high concentration impurity region placed between the first channel region and the second channel region; the two gate electrodes are separately placed above the first channel region and the second channel region and sandwich a first insulating film between the two gate electrodes and the semiconductor layer; the source electrode and the drain electrode are connected to the semiconductor layer through contact holes formed in the second insulating film; the first channel region and the second channel region are connected in series; and a channel length of the first channel region is larger than a channel length of the second channel region.

A semiconductor device of the present invention includes a semiconductor layer, two gate electrodes, a source electrode, and a drain electrode over a substrate having an insulating surface. The semiconductor layer includes a source region, a drain region, a first low concentration impurity region in contact with the source region, a first channel region in contact with the first low concentration impurity region, a second low concentration impurity region in contact with the drain region, a second channel region in contact with the second low concentration impurity region, and a high concentration impurity region placed between the first channel region and the second channel region; the two gate electrodes are separately placed above the first channel region and the second channel region and sandwich a first insulating film between the two gate electrodes and the semiconductor layer; the source electrode and the drain electrode are connected to the semiconductor layer through contact holes formed in the second insulating film; the first channel region and the second channel region are connected in series; and the relational expression $L_1 \geq 2 \times L_2$ holds when a channel length of the first channel region is $L_1$ and a channel length of the second channel region is $L_2$.

A semiconductor device of the present invention includes a semiconductor layer, two gate electrodes, a source electrode, and a drain electrode over a substrate having an insulating surface. The semiconductor layer includes a source region, a drain region, a first low concentration impurity region in contact with the source region, a first channel region in contact with the first low concentration impurity region, a second low concentration impurity region in contact with the drain region, a second channel region in contact with the second low concentration impurity region, and a high concentration impurity region placed between the first channel region and the second channel region; the first low concentration impurity region and the second low concentration impurity form region partially overlap with the gate electrode; the source electrode and the drain electrode are connected to the semiconductor layer through contact holes formed in the second insulating film; the first channel region and the second channel region are connected in series; and a channel length of the first channel region is larger than a channel length of the second channel region.

A semiconductor device of the present invention includes a semiconductor layer, two gate electrodes, a source electrode, and a drain electrode over a substrate having an insulating surface. The semiconductor layer includes a source region, a drain region, a first low concentration impurity region in contact with the source region, a first channel region in contact with the first low concentration impurity region, a second low concentration impurity region in contact with the drain region, a second channel region in contact with the second low concentration impurity region, and a high concentration impurity region placed between the first channel region and the second channel region; the first low concentration impurity region and the second low concentration impurity form region partially overlap with the gate electrode; the source electrode and the drain electrode are connected to the semiconductor layer through contact holes formed in the second insulating film; the first channel region and the second channel region are connected in series; and the relational expression $L_1 \geq 2 \times L_2$ holds when a channel length of the first channel region is $L_1$ and a channel length of the second channel region is $L_2$.

Further, in the present invention, specifically, the channel length $L_1$ is 2 μm to 10 μm, and the channel length $L_2$ is 1 μm or more, and is shorter than the channel length $L_1$ by 0.5 μm or more.

Further, in the present invention, the impurity is an impurity imparting p-type conductivity, which belongs to Group XIII of the Periodic Table, such as boron.

Further, in the present invention, the two gate electrodes are electrically connected.

Note that in the present invention, the high concentration impurity region has almost the same concentration as the source region or the drain region. Further, concentration of the first low concentration impurity region and the second low concentration impurity region are lower than that of the source region or the drain region.

Further, as to an active matrix light emitting device provided with a thin film transistor and a light emitting element, in terms of manufacturing cost, it is desirable that a partition layer is provided so as to cover an end portion of the first electrode in a light emitting element. When the partition layer is excessively thin, a step due to a wiring or a residue generated when the wiring is formed cannot be completely covered with the partition layer. Thus, the first electrode and the second electrode formed over the partition layer may be shorted-circuited.

Then, the present inventors devised a structure in which a short circuit can be prevented by forming a partition layer after forming an inorganic insulating film with a film thickness of less than 300 nm. The inorganic insulating film covers at least a top end portion of a wiring electrically connected to a TFT, and a first electrode is formed over the inorganic insulating film.

As an example is shown in FIG. 10, another structure of the present invention disclosed in this specification includes a semiconductor layer over a substrate having an insulating surface; a gate insulating film over the semiconductor layer; two gate electrodes over the gate insulating film; a first insulating film over the two gate electrodes; a source electrode and a drain electrode over the first insulating film which are connected to the semiconductor layer; a second insulating film over the source electrode and the drain electrode; a first electrode over the second insulating film; a partition layer covering an end portion of the first electrode;

a layer containing an organic compound over the first electrode; and a second electrode over the partition layer and the layer containing an organic compound, wherein the second insulating film has an opening over the drain electrode, and the drain electrode is in contact with the first electrode in the opening.

As shown in FIG. 10, by providing a fourth interlayer insulating film 700 formed from a thin inorganic insulating film, a step due to a wiring or a residue generated when the wiring is formed can be covered, thereby preventing a short circuit. Thus, reliability of the light emitting device can be improved.

Further, the TFT electrically connected to the first electrode is not limited to a multigate structure. Another structure of the present invention includes a semiconductor layer over a substrate having an insulating surface; a gate insulating film over the semiconductor layer; a gate electrode over the gate insulating film; a first insulating film over the gate electrode; a source electrode and a drain electrode over the first insulating film which are connected to the semiconductor layer; a second insulating film over the source electrode and the drain electrode; a first electrode over the second insulating film; a partition layer covering an end portion of the first electrode; a layer containing an organic compound over the first electrode; and a second electrode over the partition layer and the layer containing an organic compound, wherein the second insulating film has an opening over the drain electrode, and the drain electrode is in contact with the first electrode in the opening.

In the above structure, the first electrode is in contact with the drain electrode at least at a part of a top face of the drain electrode. When the first electrode is formed so as to cover the opening in the second insulating film, the contact surface area can be maintained constant, which is advantageous for increasing a manufacture margin.

Further, in order to reduce resistance by increasing the contact surface area, the first electrode may be in contact with a side surface of the drain electrode in addition to the top face. In the above configuration, the first electrode is in contact with the drain region at least at a part of the side surface.

Further, when the contact surface area is sufficient, the first electrode is not necessarily required to cover the opening in the second insulating film. In the case of not covering the opening, the drain electrode is in contact with the partition layer in the opening of the second insulating film.

In the above structure, the first insulating film has an opening over the semiconductor layer, the semiconductor layer is in contact with the drain electrode in the opening, and the opening of the first insulating film overlaps with the opening of the second insulating film. When the opening in the first insulating film and the opening in the second insulating film overlap, the area occupied for connecting the TFT to the light emitting element is reduced, and the aperture ratio of the light emitting device is improved. Further, the recessed portion is covered with a partition layer even when the opening of the first insulating film and the opening of the second insulating film overlap; thus, a short circuit can be prevented Further, the film thickness of the second insulating film is thinner than the first insulating film, and the film thickness of the second insulating film is 50 nm or more and less than 300 nm. Further, it is preferable that the thickness of the second dins film is thinner than the thickness of the drain electrode.

Further, the first insulating film and the second insulating film are inorganic insulating films such as a silicon oxide film, a silicon nitride film, or a silicon oxynitride ($SiO_xN_y$) film. Such an inorganic insulating film can protect the light emitting element compared with an organic insulating film from moisture and oxygen which is considered to cause deterioration of the light emitting element.

By applying the present invention, an n-channel transistor having a multigate structure in which OFF-state current is reduced and the characteristics of the transistor are improved can be provided. Further, reliability of the semiconductor device provided with such an n-channel transistor having a multigate structure can be improved. In addition, reliability of an electronic device provided with a semiconductor device can be improved. Note that OFF-state current is a leakage current which flows when a polarity of an electric potential by which an inversion layer is not formed is applied to a transistor. Moreover, in the case where the transistor is used as a switching element, OFF-state current also means a current which flows in a location where no current should flow. Further, in accordance with the present invention, characteristic defects of a p-channel transistor (specifically, knot-like characteristic defects generated in a rising portion of an Id-Vg curve) can be suppressed.

Further, by applying the present invention in which a top end portion of a wiring is covered with an inorganic insulating film a film thickness of 300 nm or less, display defects called dark points which are caused due to a residue generated in forming a wiring when manufacturing a light-emitting display device can be reduced. Note that, the display defects called dark points means pixels of which luminance is reduced compared with other pixels when desired luminance cannot be obtained display is performed by a light-emitting display device.

BRIEF DESCRIPTION OF DRAWINGS

In the accompanying drawings,

FIGS. 5A to 5D are figures illustrating en example a method for manufacturing a semiconductor device of the present invention;

FIGS. 6A to 6C are figures illustrating en example a method for manufacturing a semiconductor device of the present invention;

FIGS. 17A to 17E are figures illustrating examples of measured results of characteristic defects;

BEST MODE FOR CARRYING OUT THE INVENTION

Embodiment Mode

Figure 1A:
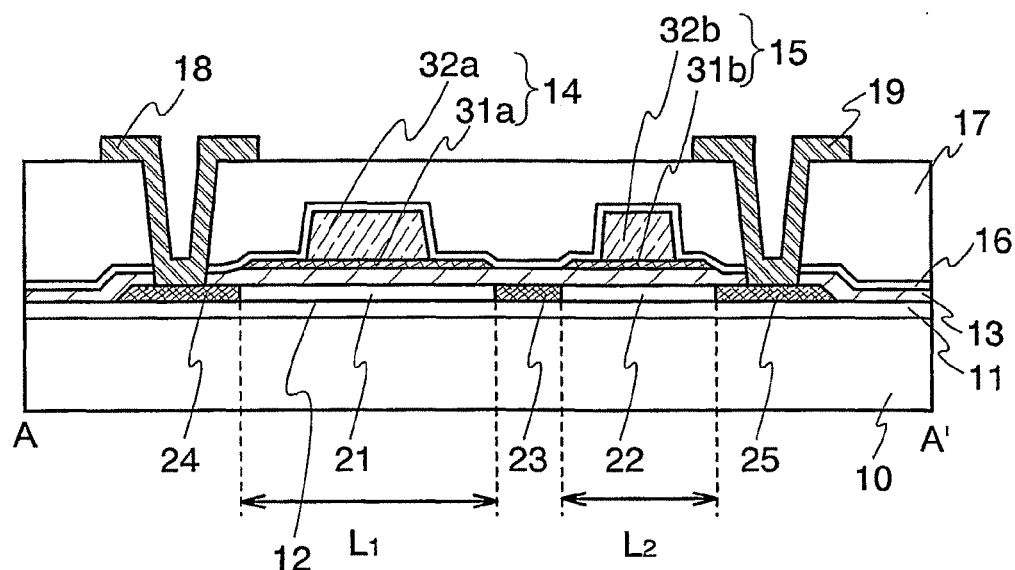
FIGS. 1A and 1B are cross-sectional views illustrating en example of a semiconductor device of the present invention.

Hereinafter, embodiment modes and embodiments of the present invention will be described in detail with reference to the accompanying drawings. Note that the present invention is not limited to the description below, and it is easily understood by those skilled in the art that modes and details can be modified in various ways without departing from the spirit and the scope of the present invention. Therefore, the present invention should not be understood as being construed to the description of the embodiment modes and embodiments to be given below. Note that in structures of the present invention described below, the reference numerals indicating the same components are used in common in the drawings.

Embodiment Mode 1

The present invention relates to a transistor having a multigate structure. A thin film transistor (abbreviation: TFT) is used as a transistor hereinafter. An embodiment mode of the present invention will be described in details with reference to FIGS. 1A and 1B.

Figure 1B:
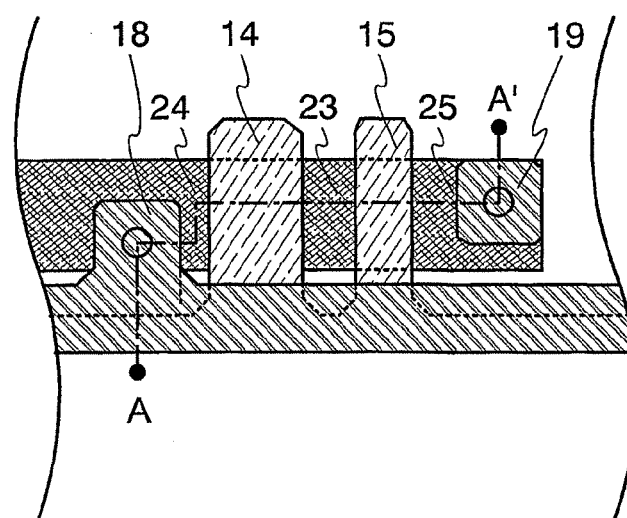
Figure 2A:
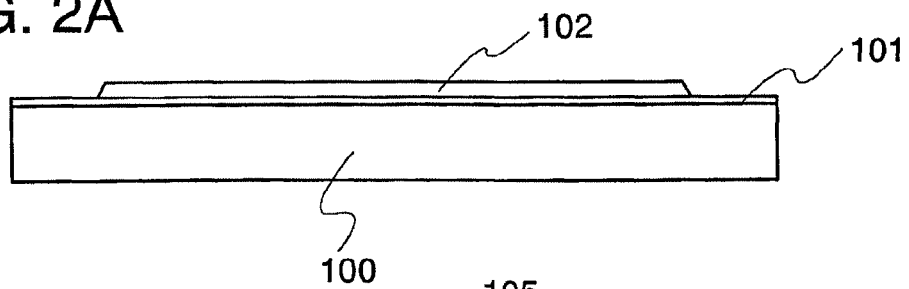
FIGS. 2A to 2D are cross-sectional views illustrating en example a method for manufacturing a semiconductor device of the present invention.
Figure 2B:
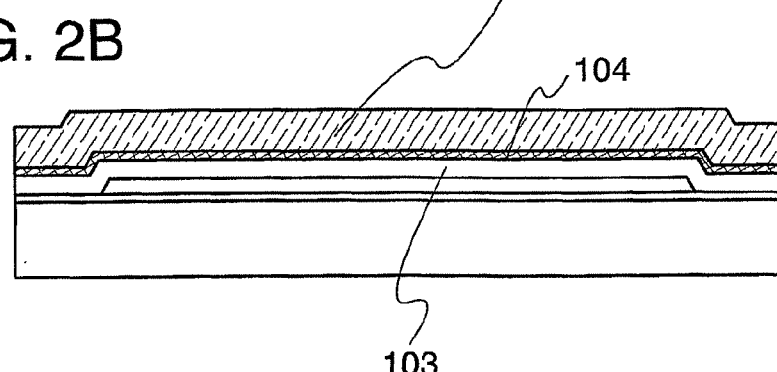
Figure 2C:
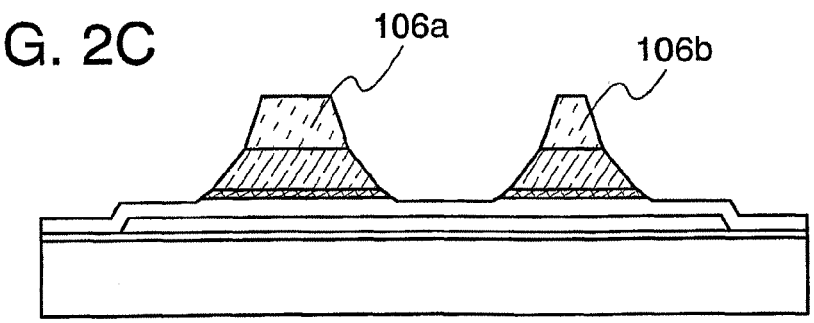
Figure 2D:
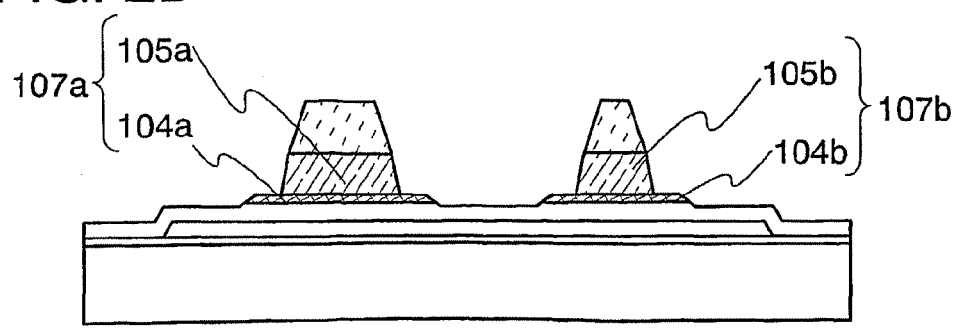
Figure 3A:
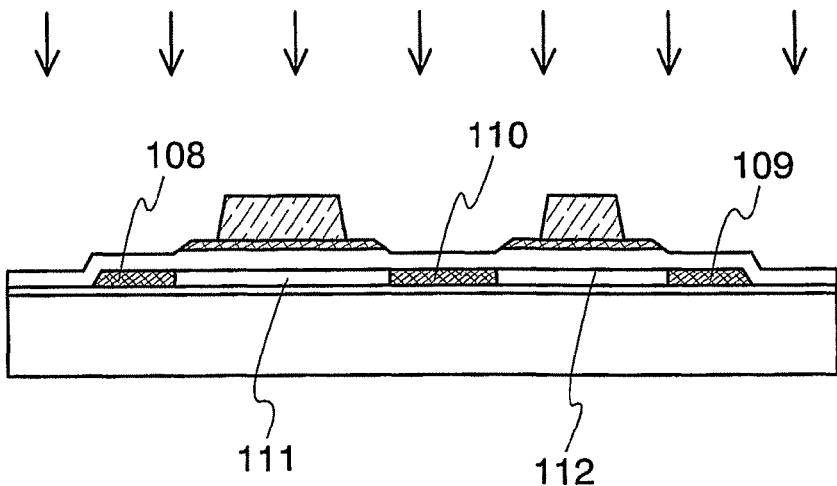
FIGS. 3A to 3C are cross-sectional views illustrating en example a method for manufacturing a semiconductor device of the present invention.
Figure 3B:
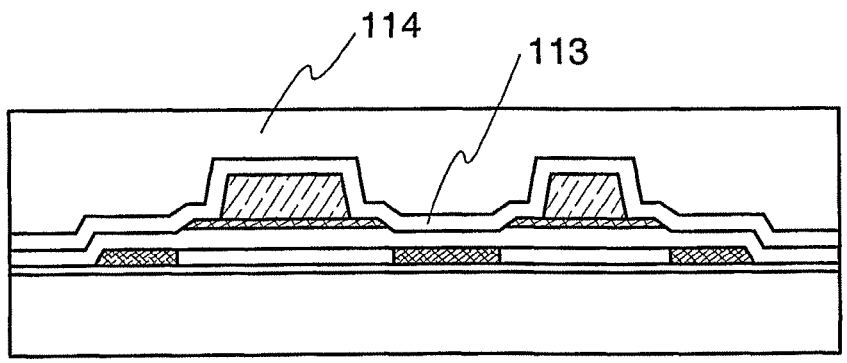
Figure 3C:
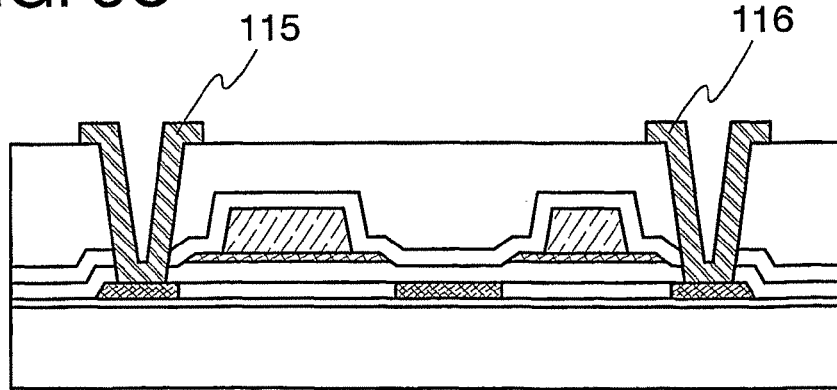

FIG. 1A is a cross-sectional view illustrating an example of a TFT having a multigate structure. FIG. 1B shows a schematic view of the top face of the TFT. Note that the cross-section taken along chain line A-A' in FIG. 1B corresponds to a cross-sectional view of FIG. 1A. In this embodiment mode, an example of a TFT having two gate electrodes and two channel regions connected in series will be described.

In a TFT of the present invention, a first insulating film 11 is formed over a substrate 10 and a semiconductor layer 12 is formed over the first insulating film 11. A second insulating film 13 is formed over the semiconductor layer 12 and two gate electrodes are formed over the second insulating film 13. A third insulating film 16 and a fourth insulating film 17 are formed as interlayer insulating films over the two gate electrodes.

The semiconductor layer 12 includes a source region 24 and a drain region 25 placed under portions outside the two gate electrodes over the second insulating film 13; two channel regions connected in series which are placed between the source region 24 and the drain region 25; and a high concentration impurity region 23 placed between the two channel regions. Note that the high concentration impurity region is a region which contains impurities at almost the same concentration as the source region 24 or the drain region 25.

In this embodiment mode, with respect to the two channel regions, a channel region in contact with the source region 24 is a first channel region 21, and a channel region in contact with the drain region 25 is a second channel region 22. With respect to the two gate electrodes, a gate electrode placed over the first channel region 21 on the second insulating film 13 is a first gate electrode 14, and a gate electrode placed over the second channel region 22 on the second insulating film 13 is a second gate electrode 15.

Note that, in this embodiment mode, two gate electrodes have layered structures severally including two conductive layers 31a and 31b, and two conductive layers 32a and 32b. The present invention is not limited thereto; the gate electrodes may have a single-layered structure or a layered structure including three or more conductive layers. In addition, the two gate electrodes are electrically connected to each other.

Contact holes are provided in the second insulating film 13, the third insulating film 16, and the fourth insulating film 17, so as to expose the source region 24 and the drain region 25. Further, a source electrode 18 is formed over the contact hole reaching the source region 24, and a drain electrode 19 is formed over the contact hole reaching the drain region 25.

Note that in the present invention, an impurity region placed between the two channel regions 21 and 22 named as the high concentration impurity region 23; the high concentration impurity region 23 serves as a drain region with respect to the source region 24 of a TFT (a first TFT) having the first gate electrode 14, meanwhile, it serves as a source region with respect to the drain region 25 of a TFT (a second TFT) having the second gate electrode 15. Further, in order to reduce OFF-state current of an n-channel TFT, the high concentration impurity region 23 between the two channel regions 21 and 22 is very effective.

A feature of a TFT of the present invention is that a channel length $L_1$ of the first channel region 21 is longer than a channel length $L_2$ of the second channel region 22. Note that channel length means the length of a channel region which is a path of current connecting a source region and a drain region under a gate electrode under. In a TFT of this embodiment mode, distance between the source region 24 and the high concentration impurity region 23 (drain region) is the channel length $L_1$, and distance between the high concentration impurity region 23 (source region) and the drain region 25 is the channel length $L_2$.

Further, another feature of a TFT of the present invention is that between the channel lengths $L_1$ and $L_2$, the relational expression $L_1 > L_2$ (preferably $3 \times L_1 \geq 5 \times L_2$, more preferably $L_1 \geq 2 \times L_2$) holds.

In the present invention, the channel lengths $L_1$ and $L_2$ are not limited to a certain range of value; however, at least the channel length $L_1$ has a length which does not cause a short channel effect, specifically the $L_1$ is 2 μm to 8 μm (preferably 4 μm to 6 μm). Further, the channel length $L_2$ is 1 μm or more, and is shorter than $L_1$ by 0.5 μm or more. In addition, the channel width is 1 μm to 50 μm (preferably 5 μm to 30 μm).

Further, the channel length $L_1$ has almost the same length as the first gate electrode 14 (first conductive layer 31a), and the channel length $L_2$ has almost the same length as the second gate electrode 15 (first conductive layer 31b). Accordingly, it is also a feature of a TFT of the present invention that the first gate electrode 14 is longer than that of the second gate electrode 15 in size in the channel length direction.

Further, in this embodiment mode, a TFT having a multigate structure including two gate electrodes 14 and 15 and two channel regions 21 and 22 connected in series is described; however, the present invention is not limited thereto. Alternatively, a TFT having a multigate structure including three or more gate electrodes and three or more channel regions connected in series may be used. Note that also in the case where a TFT has there or more gate electrodes, the gate electrodes are electrically connected.

In accordance with this embodiment mode, a TFT having a multigate structure of the present invention is applied, thereby preventing characteristic defects of the TFT. As a result, operating characteristics and reliability of the TFT can be improved.

In addition, a TFT of the present invention can be applied to either an n-channel TFT or a p-channel TFT. In the case of using an n-channel having a multigate structure, OFF-state current can be reduced. Further, in the case of using a p-channel TFT having a multigate structure, characteristic defects (specifically, knot-like characteristic defects generated in a rising portion of an Id-Vg curve) can be suppressed.

Embodiment Mode 2

In this embodiment mode, examples of methods of manufacturing TFTs having multigate structures of the present invention will be described with reference to FIGS. 2A to 2D and FIG. 3A to 3C.

First, first insulating film 101 is formed over a substrate 100 having an insulating surface. As the substrate 100, a light-transmitting substrate, for example, a glass substrate, a crystallized glass substrate, or a plastic substrate (polyimide, acrylic, polyethylene terephthalate, polycarbonate, polyarylate, polyethersulfone, or the like) can be used. When a thin film transistor to be formed later is applied to a top-emission (upward emission) light-emitting display device, or applied to a reflective liquid crystal display device, a ceramics substrate, a semiconductor substrate, a metal substrate (tantalum, tungsten, molybdenum, or the like), and the like can also be used. Any substrate can be used as long as it resists at least heat generated in processes.

As the first insulating film 101, an insulating film such as a silicon oxide film, a silicon nitride film, or a silicon oxynitride film ($SiO_xN_y$) is used, and a single layer or a multi-layer having a plurality of such insulating layers are used. The first insulating film 101 may be formed by a known method (such as sputtering, LPCVD, or plasma CVD). In this embodiment mode, the insulating film 101 has a single-layered structure; alternatively, it may have a multi-layer having two or more layers.

Then, a semiconductor layer 102 is formed over the first insulating film 101. As the first insulating film 101, silicon, a silicon-germanium (SiGe) alloy, or the like can be used. First, an amorphous semiconductor film is formed by a known method (such as sputtering, LPCVD, or plasma CVD), and crystallized after that by a known crystallization method (laser irradiation, thermal crystallization, thermal crystallization using a catalytic element, or the like) to obtain a crystalline semiconductor film.

In the case of forming a semiconductor film by a thermal crystallization method, a furnace, laser irradiation, or RTA (Rapid Thermal Annealing), or combination thereof can be used.

Further, in the case of forming a crystalline semiconductor film by a thermal crystallization method using a catalytic element such as nickel, gettering for removing a catalytic element such as nickel after crystallization is preferably carried out.

Alternatively, in the case of forming a crystalline semiconductor film by laser crystallization, a continuous wave laser beam (a CW laser beam) and a pulsed laser beam can be used. As laser beams that can be used here, laser beams emitted from one or more kinds of gas lasers such as an Ar laser, a Kr laser, and an excimer laser; lasers using, as a medium, a single crystal of YAG, $YVO_4$, forsterite ($Mg_2SiO_4$), $YAlO_3$, or $GdVO_4$ or a polycrystal (ceramics) of YAG, $Y_2O_3$, $YVO_4$, $YAlO_3$, or $GdVO_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser can be used. Irradiation with the fundamental waves of these laser beams and the second harmonic to fourth harmonic laser beams of these lasers allow large crystals in grain size to be obtained. For example, the second harmonic (532 nm) and the third harmonic (355 nm) of an Nd:$YVO_4$ laser (fundamental wave: 1064 nm) can be used. The power density of the laser in this case is required to be approximately 0.01 $MW/cm^2$ to 100 (preferably 0.1 $MW/cm^2$ to 10). Then, irradiation is carried out at a scanning rate of approximately 10 cm/sec to 2000 cm/sec.

Further, a laser using, as a medium, a single crystal of YAG, $YVO_4$, forsterite ($Mg_2SiO_4$), $YAlO_3$, or $GdVO_4$ or a polycrystal (ceramics) of YAG, $Y_2O_3$, $YVO_4$, $YAlO_3$, or $GdVO_4$ doped with one or more of Nd, Yb, Cr, Ti, Ho, Er, Tm, and Ta as a dopant; an Ar laser; or a Ti: sapphire laser is capable of continuous wave oscillation. Also, pulsed emission at a repetition rate of 10 MHz or more is possible by carrying out Q-switch operation, mode locking, or the like. When pulsed emission at a repetition rate of 10 MHz or more is carried out, the semiconductor film is irradiated with the next pulse after the semiconductor film is melted by laser before solidification thereof. Accordingly, unlike a case of using a pulsed laser at a lower repetition rate, the solid-liquid interface in the semiconductor film can be continuously moved, so that crystal grains continuously grown in the scanning direction can be obtained.

The use of ceramics (a polycrystal) as the medium allows the medium to be formed in any shape at low cost in a short amount of time. While a columnar medium of several millimeters in diameter and several tens millimeters in length is typically used in the case of using a single crystal, larger mediums in size can be formed in the case of using ceramics.

Since the concentration of the dopant in the medium, such as Nd and Yb, which directly contributes to luminescence, cannot be significantly changed, there is some limit on improvement in laser power by increasing the concentration. However, in the case of ceramics, drastic improvement in power can be expected since the size of the medium can be significantly increased as compared with single crystals.

Further, in the case of ceramics, a medium in the shape of a parallelepiped or a rectangular parallelepiped can be easily formed. When a medium in this shape is used to make emitted light travel in a zigzag manner within the medium, the path of emitted light can be made longer. Therefore, the amplification is increased to enable oscillation with high output power. In addition, a laser beam that is emitted from a medium in this shape has a quadrangular cross section when the beam is emitted, and is therefore advantageous when shaped into a linear beam as compared with a circular beam. Thus shaping the emitted laser beam with the use of an optical system makes it possible to easily obtain a linear laser beam that has a shorter side of 1 mm or less in length and a longer side of several millimeters to several meters in length. In addition, irradiating the medium with excitation light makes the linear beam have uniform energy distribution in the longer side direction.

Irradiation of the entire surface of the semiconductor film with this linear beam allows more uniform heat treatment of the entire semiconductor film. When uniform heat treatment is required for the both ends of the linear beam, a measure of providing slits, at opposite ends for shielding an energy attenuating portion from light, or the like is required.

When the obtained uniform intensity linear beam is used to heat-treat the semiconductor film and this semiconductor film is used to manufacture an electronic device, the electronic device has favorable and uniform characteristics.

Then, if necessary, the crystalline semiconductor film obtained through the above crystallization process is doped with a slight mount of impurity element (boron or phosphorous to control the threshold voltage of the TFT. Ion doping with plasma excited diborane ($B_2H_6$) without mass separation is used here.

Further, after treating a surface of the crystalline semiconductor film with etchant including hydrofluoric acid, a first resist mask is formed over the crystalline semiconductor film. Then, the crystalline semiconductor film is formed into intended shapes using the first resist mask so that a semiconductor layer 102 is formed. A thickness of the semiconductor layer 102 is preferably 25 nm to 80 nm (more preferably 30 nm to 70 nm). After forming the semiconductor layer 102, the first resist mask is removed.

Next, a second insulating film 103 (serving as a gate insulating film) which covers the semiconductor layer 102 is formed. As the second insulating film 103, an insulating film such as a silicon oxide film, a silicon nitride film, or a silicon oxynitride film can be used. The second insulating film 103 may be formed to a thickness of 1 nm to 200 nm (preferably 50 nm to 120 nm) by plasma CVD, sputtering, or thermal oxidation method.

Next, a first gate electrode 107a and a second gate electrode 107b are formed. First, a stack of a first conductive layer 104 and a second conductive layer 105 is formed over the second insulating film 103. For the first conductive layer 104 and the second conductive layer 105, a conductive material of a high melting point metal such as tungsten (W), chromium (Cr), tantalum (Ta), nitride tantalum (TaN), or molybdenum (Mo), or an alloy or a compound containing such a high melting point metal as a main component, or the like can be used. Note that the first conductive layer 104 and the second conductive layer 105 may be formed of the same conductive material or different conductive materials. Further, this embodiment mode, a layered structure including two layers of conductive layers; however, one layer or a layered structure including three or more layers may be used instead. The first conductive layer 104 and the second conductive layer 105 may be formed by a known manufacturing method such as sputtering or vapor deposition. The film thickness of the first conductive layer 104 film thickness may be 10 nm to 100 nm (preferably 20 nm to 50 nm), the film thickness of the second conductive layer 105 may be 100 nm to 600 nm (preferably 300 nm to 500 nm).

Next, second resist masks 106a and 106b are formed over the second conductive layer 105. Hereupon, the second resist mask 106a is formed over the second conductive layer 105a where the first gate electrode 107a is to be formed later, and the second resist mask 106b is formed over the second conductive layer 105b where the second gate electrode 107b is to be formed later. Further, the second resist mask 106a is formed so as to be larger than the second resist mask 106b.

Next, a first etching treatment and a second etching treatment are carried out using the second resist masks 106a and 106b. An etching method for carrying out the first etching treatment and the second etching treatment may be selected as appropriate. In order to improve the etching rate, a dry etching device using a high density plasma source of ECR (Electron Cyclotron Resonance) or ICP (Inductively Coupled Plasma: inductively coupling plasma) or the like can be used. By controlling etching conditions in accordance with the first etching treatment and the second etching treatment, end portions of the first conductive layer 104 and the second conductive layer 105 can be formed into a desired tapered shape. Through the above process, the first gate electrode 107a formed from a stack of the first conductive layer 104a and the second conductive layer 105a, and the second gate electrode 107b formed from a stack of the first conductive layer 104b and the second conductive layer 105b can be formed. After that, the second resist masks 106a and 106b are removed.

Next, the semiconductor layer 102 is added with an impurity having a sort of conductivity type using the first gate electrode 107a and the second gate electrode 107b as masks, thereby forming a source region 108, a drain region 109, and a high concentration impurity region 110. Hereupon, a region where the impurity ion having a sort of conductivity type is not added is to be a channel region. A plurality of channel regions is formed in the semiconductor layer 102; here, two channel regions are formed. In this specification, a channel region placed under the first gate electrode 107a is a first channel region 111, and a channel region placed under the second gate electrode 107b is a second channel region 112. Further, the impurity region of a sort of conductivity type between the first channel region 111 and the second channel region 112 is the high concentration impurity region 110. Note that the a sort of conductivity impurity to be added may be either a p-type impurity or an n-type impurity.

Here, channel length $L_1$ of the first channel region 111 of a TFT formed in this embodiment mode is longer than channel length $L_2$ of the second channel region 112. Specifically, the channel regions are formed so that, between the channel lengths $L_1$ and $L_2$, the relational expression $L_1 > L_2$ (preferably $3 \times L_1 \geq 5 \times L_2$, more preferably $L_1 \geq 2 \times L_2$) holds.

Further, the channel lengths $L_1$ and $L_2$ are not limited to a certain range of value as long as at least the channel length $L_1$ has a length which does not cause a short channel effect. Specifically, the $L_1$ is preferably in the range of 2 μm to 8 μm (typically 4 μm to 6 μm). Further, the channel length $L_2$ is 1 μM or more, and is shorter than $L_1$ by 0.5 μm or more. In addition, the channel width is 1 μm to 50 μm (preferably 5 μm to 30 μm).

The size (shape) of the first conductive layers 104a and 104b is necessarily deigned so that between the channel length $L_1$ of the first channel region 111 and $L_2$ of the second channel region 112, the relational expression $L_1 > L_2$ (preferably $3 \times L_1 \geq 5 \times L_2$, more preferably $L_1 \geq 2 \times L_2$) holds.

Further, a low concentration impurity region (hereinafter, LDD region) may be formed in the semiconductor layer 102. The LDD region may be formed in a self-aligned manner using patterns of the second conductive layers 105a and 105b; alternatively, it may be formed using a new resist mask.

Next, an interlayer insulating film formed. In this embodiment mode, a stack of a third insulating film 113 and a fourth insulating film 114 is faulted as the interlayer insulating film. An inorganic insulating film such as a silicon oxide film, a silicon nitride film, or a silicon oxynitride ($SiO_xN_y$) film, or a low-k organic resin film (photosensitive or non-photosensitive organic resin film) can be used for the third insulating film 113 and fourth insulating film 114. Further, a film containing siloxane may be used. Siloxane is a material that has a skeletal structure formed from a bond of silicon (Si) and oxygen (O), where an organic group (for example, an alkyl group or aromatic hydrocarbon) is used as a substituent. A fluoro group may be used as a substituent. Alternatively, an organic group and a fluoro group may be used as substituents.

The third insulating film 113 and the fourth insulating film 114 may be formed using the same insulating films, or different insulating films. Further, in this embodiment mode, the interlayer insulating film has a layered structure including two layers; however, one layer or a layered structure including three or more layers may be used.

The third insulating film 113 and the fourth insulating film 114 can be formed by a known method (such as sputtering, LPCVD, plasma CVD, or spin coating). In the case of using an organic resin film or a film containinng siloxane, a coating method may be used.

Next, activation of an impurity element added to the semiconductor layer 102 and hydrogenation are carried out. Note that, in the case where the semiconductor film is crystallized by a thermal crystallization method using a catalytic element such as nickel, gettering for reducing nickel in the channel region can be reduced by gettering at the same time as the activation. Specifically, nickel contained in the channel region can be moved to the source region or drain region by heat treatment for the activation. Accordingly, nickel contained in the channel region can be reduced.

Next, a third resist mask is formed over the fourth insulating film (interlayer insulating film) 114. Further, the second insulating film 103, the third insulating film 113 and the fourth insulating film 114 are electively etched using the third resist mask, thereby forming contact holes reaching the semiconductor layer 102 (the source region 108 or the drain region 109). After that, the third resist mask is removed.

Next, a source electrode 115 and a drain electrode 116 are formed. First, a stacked metal film is formed over the fourth insulating film 114 (film serving as an interlayer insulating film). A metal of gold (Ag), silver (Au), copper (Cu), nickel (Ni), platinum (Pt), palladium (Pd), iridium (Ir), rhodium (Rh), tungsten (W), aluminum (Al), tantalum (Ta), molybdenum (Mo), cadmium (Cd), zinc (Zn), iron (Fe), titanium (Ti), silicon (Si), germanium (Ge), zirconium (Zr), barium (Ba), or the like, an alloy or a metal nitride thereof, or a stack thereof can be used for the stacked metal film.

In this embodiment mode, the stacked metal film has a layered structure including three layers. The stacked metal film may be formed by a known method such as PVD method, CVD, sputtering, or vapor deposition to a thickness of 500 nm to 2 µm (preferably 800 nm to 1 µm) in total. Note that, the layers are preferably formed sequentially in the same sputtering apparatus. Further, the stacked metal film may have one layer or two layers, or a layered structure including four or more layers.

Next, a fourth resist mask is formed over the stacked metal film. Further, the stacked metal film is selectively etched using the fourth resist mask, thereby forming the source electrode 115 electrically to the source region 108 and the drain electrode 116 electrically connected to the drain region 109. After that, the fourth resist mask is removed.

Note that, a connection electrode (electrode which connects a plurality of TFTs) or a terminal electrode (electrode for the connection with an external power supply) can be formed over the fourth insulating film 114 at the same time as the source electrode 115 and the drain electrode 116 of the TFT.

Through the above steps, a TFT having the multigate structure can be formed.

Embodiment Mode 3

In this embodiment mode, a case where a semiconductor layer includes an LDD region will be explained with reference to FIGS. 4A and 4B. Since the components except for a semiconductor layer are the same as Embodiment mode 1 or Embodiment mode 2, the description will not be repeated.

Figure 4A:
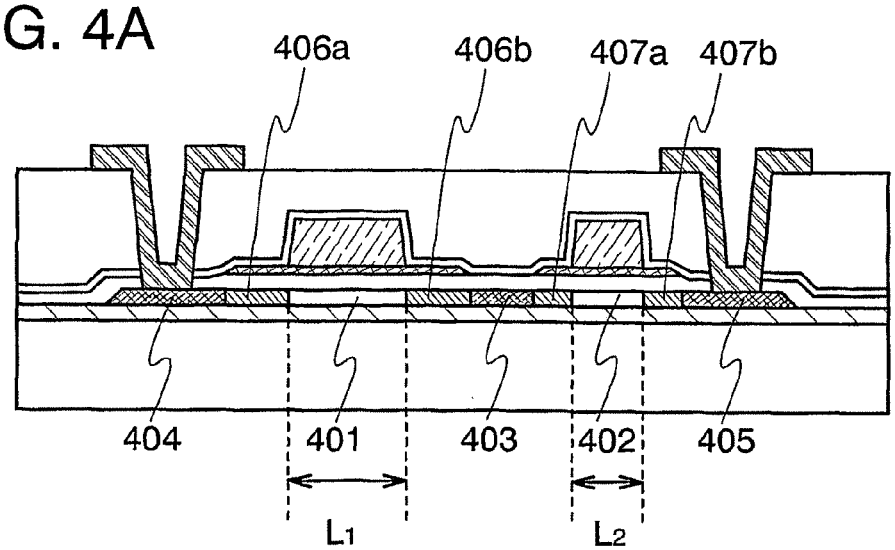
FIGS. 4A and 4B are cross-sectional views illustrating en example of a semiconductor device of the present invention.

A semiconductor layer of a TFT of this embodiment mode which is shown in FIG. 4A includes two channel regions placed in series (a first channel region 401 and a second channel region 402); a high concentration impurity region 403 placed between the two channel regions; a source region 404 and a drain region 405 placed under areas outside the two gate electrodes (a first gate electrode and a second gate electrode) over a second insulating film, a pair of first LDD regions 406a and 406b respectively placed between the source region 404 and the first channel region 401 and between the first channel region 401 and the high concentration impurity region 403; and a pair of second LDD regions 407a and 407b respectively placed between the drain region 405 an the second channel region 402 and between the second channel region 402 and the high concentration impurity region 403. The first gate electrode and the second gate electrode are electrically connected.

In also the TFT of this embodiment mode, which is shown in FIG. 4A, it is a feature that a channel length $L_1$ of the first channel region 401 is longer than a channel length $L_2$ of the second channel region 402. Specifically, between the channel lengths $L_1$ and $L_2$, the relational expression $L_1 > L_2$ (preferably $3 \times L_1 \geq 5 \times L_2$, more preferably $L_1 \geq 2 \times L_2$) holds.

In the TFT of this embodiment mode, which is shown in FIG. 4A, the channel length $L_1$ is almost the same as the length of a second conductive layer forming the first gate electrode, and the channel length $L_2$ is almost the same as the length of a second conductive layer forming the second gate electrode; however, they are not limited thereto. Specifically, any length may be set as long as the channel length $L_1$ of the first channel region 401 is longer than the channel length $L_2$ of the second channel region 402.

In addition, the TFT of this embodiment mode, which is shown in FIG. 4A, has a region where the first LDD regions 406a and 406b overlap with the first gate electrode with the second insulating film therebetween, and a region where the second LDD regions 407a and 407b overlap with the second gate electrode with the second insulating film therebetween.

Further, in the TFT of this embodiment mode, which is shown in FIG. 4A, the lengths of the first LDD regions 406a and 406b are almost the same as the lengths of areas in the first conductive layer which do not overlap with the second conductive layer forming the first gate electrode, and the length of the second LDD regions 407a and 407b are almost the same as the length of areas in the second conductive layer forming the second gate electrode; however, the present invention is not limited thereto. Specifically, any length may be set as long as the first LDD regions 406a and 406b partially overlap with the first gate electrode, and the second LDD regions 407a and 407b partially overlap with the second gate electrode.

Further, in the TFT of this embodiment mode, which is shown in FIG. 4A, the pair of first LDD regions 406a and 406b are provided so as to sandwich the first channel region 401; however, the present invention is not limited thereto. The first LDD regions may be provided only on one side. Similarly, the second LDD regions 407a and 407b may also be provided on one side.

In FIG. 4A, the concentration of the impurity in the high concentration impurity region 403 is almost the same as the concentration of the source region 404 or the drain region 405. Further, the concentration of the impurity in the first low concentration impurity regions 406a and 406b and the second low concentration impurity regions 407a and 407b is lower than in the source region 404 or the drain region 405.

Next, a case where the semiconductor layer includes two channel regions 411 and 412, a high concentration impurity region 413, a source region 414, a drain region 415, first LDD regions 416a and 416b, and second LDD regions 417a and 417b will be described with reference to FIG. 4B. Since a structure in FIG. 4B is the same as FIG. 4A except for the positions of the LDD regions, the description will not be repeated.

Figure 4B:
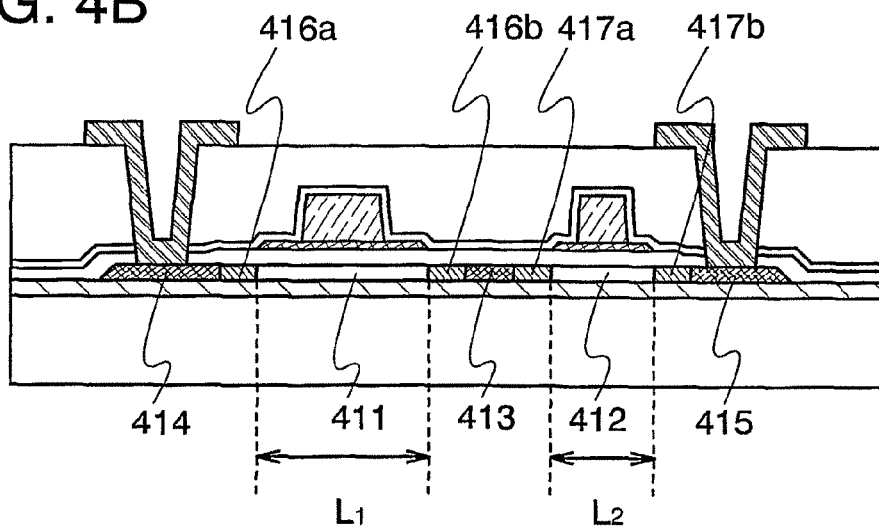

In FIG. 4B, the first LDD regions 416a and 416b are placed under areas outside the first gate electrode over a second insulating film, meanwhile, the second LDD regions 417a and 417b are placed under areas outside the second gate electrode over the insulating film.

Specifically, in FIG. 4B, it is a feature that the first LDD regions 416a and 416b do not overlap with the first gate electrode over the second insulating film, and the second LDD regions 417a and 417b do not overlap with the second gate electrode over the second insulating film. In addition, the first gate electrode and the second gate electrode are electrically connected.

Further, in FIG. 4B, since the first LDD regions 416a and 416b are formed under the areas outside the first gate electrode over the second insulating film, the channel length $L_1$ is almost the same as the length of the first gate electrode (first conductive layer). Meanwhile, since the second LDD regions 417a and 417b are formed under the areas outside the second gate electrode over the second insulating film, the channel length $L_2$ is almost the same as the length of the second gate electrode (first conductive layer). The present invention is not limited thereto, and the any length may be set as long as the channel length $L_1$ of the first channel region 411 is longer than the channel length $L_2$ of the second channel region 412. Specifically, a feature that between the channel lengths $L_1$ and $L_2$, the relational expression $L_1 > L_2$ (preferably $3 \times L_1 \geq 5 \times L_2$, more preferably $L_1 \geq 2 \times L_2$) holds is only required.

Further, in FIG. 4B, the pair of first LDD regions 406a and 406b are provided so as to sandwich the first channel region 411; however, the present invention is not limited thereto, the first LDD regions may be provided on only one side. Similarly, the second LDD regions 407a and 407b may also be provided on only one side.

In FIG. 4B, the concentration of the impurity in the high concentration impurity region 413 is almost the same as the concentration of the source region 414 or the drain region 415. Further, the concentration of the impurity in the first low concentration impurity regions 416a and 416b and the second low concentration impurity regions 417a and 417b is lower than in the source region 414 or the drain region 415.

Embodiment Mode 4

In this embodiment mode, a structure and a manufacturing method of an active matrix light emitting device in which a pixel area and a driver circuit area are formed over one substrate will be explained with reference to FIG. 5A to FIG. 7.

Further, in a pixel provided in the pixel area, a first TFT serving as a switching element which switches between ON-state and OFF-state of the pixel (hereinafter, switching TFT) and a second TFT which controls current supplied to a light emitting element (hereinafter, driving TFT) are formed. Further, in the driver circuit area, a TFT which drives the pixel area is formed. Note that, it is a feature of this embodiment mode that a TFT of the present invention can be used for a driving TFT to be formed in a pixel area.

First, base insulating films 501a and 501b are formed over a substrate 500. In the case of obtaining light from a display surface on the substrate 500 side, a glass substrate or a quartz substrate which are transparent to light can be used as the substrate 500. Further, a thermostable plastic substrate which can resist a processing temperature in a process may be used. In the case of obtaining light from a display surface on the opposite side of the substrate 500, other than the substrates above, a silicon substrate, a metal substrate, or a stainless-steel substrate on a surface of which an insulating film is formed may also be used. Any substrate can be used as long as it can resist heat generated in a process. In this embodiment mode, a glass substrate is used as the substrate 500. Note that the refractive index of a glass substrate is about 1.55.

A single layer or a plurality or layers of insulating films such as a silicon oxide film, a silicon nitride film, or a silicon oxynitride film is used to form the base insulating films 501a and 501b. The base insulating films 501a and 501b are formed by a known method such as sputtering, LPCVD, plasma CVD. In this embodiment mode, the base insulating films 501a and 501b has a two-layered structure including silicon oxynitride films having different composition ratios. As the insulating film 501a in the first layer, a silicon oxynitride film (composition ratio: Si=32%, O=27%, N=24%, H=17%) is formed to 140 nm by plasma CVD using $SiH_4$, $NH_3$, and $N_2O$ as a reactive gas. After that, as the base insulating film 501b in the second layer, a silicon nitride oxide film (composition ratio: Si=32%, O=59%, N=7%, H=2%) is formed to 100 nm by plasma CVD using $SiH_4$ and $N_2O$ as reactive gas. Note that, in this embodiment mode, the base insulating film has a layered structure including two layers; however, a single layer of a plurality of layers of three or more layers may be used instead. Further, when irregularities on the substrate or diffusion of impurities from the substrate matter, the base insulating films are not necessarily formed.

Next, semiconductor layers 502, 503, 504, and 505 are formed over the base insulating film 501b. The semiconductor layers 502 to 505 are formed by first forming an amorphous semiconductor film by a known method (sputtering, LPCVD, plasma CVD, or the like) and then crystallizing the amorphous semiconductor film by a known crystallization process (such as laser crystallization, thermal crystallization, or thermal crystallization using a catalytic element such as nickel), thereby a crystalline semiconductor film is obtained. After that, a first resist mask is formed, and the crystalline semiconductor film is patterned into a desired shape.

In this embodiment mode, a thermal crystallization method using nickel as a catalytic element is used to crystallize the amorphous semiconductor film. Hereinafter, a method of forming a crystalline semiconductor film by a thermal crystallization method using nickel will be described.

First, an amorphous semiconductor film is formed over the base insulating film to a film thickness of 50 nm by plasma CVD. Note that, when plasma CVD is used, the base insulating film and the amorphous semiconductor film can be stacked continuously without exposure to the atmosphere. The film thickness of the amorphous semiconductor film may be formed to a thickness range of 25 nm to 80 nm (preferably 30 nm to 70 nm). Further, the material of the amorphous semiconductor film is not limited; however, silicon or a silicon germanium (SiGe) alloy may preferably used.

Next, the amorphous semiconductor film is coated with a solution (an aqueous solution or an acetic acid solution) containing nickel by a coating method such as spin coating or dip coating, thereby forming a film containing nickel. Note that, the catalytic element is not limited to nickel, and an element such as germanium (Ge), iron (Fe), palladium (Pd), tin (Sn), lead (Pb), cobalt (Co), platinum (Pt), copper (Cu), or gold (Au) may be used instead. Since the film containing nickel is extremely thin, there are some cases where it is not observed as a film.

In addition, the film containing nickel may be formed by plasma CVD, sputtering, or vapor deposition without limitation to a coating method. Here, the whole surface of the amorphous semiconductor film is coated with a nickel acetate solution, which contains nickel of 1 ppm to 100 ppm (preferably 10 ppm) by weight, by spin coating.

Further, before coating the whole surface with the nickel acetate solution, UV irradiation in an oxygen atmosphere, thermal oxidation, or a treatment using ozone water containing hydroxyl radical or hydrogen peroxide, is carried out to form an oxide film to a thickness of 1 nm to 5 nm on the amorphous semiconductor film. A thin oxide film is formed in this manner, so that the wettability between the amorphous semiconductor film and the nickel acetate solution can be increased, and the amorphous semiconductor film can be uniformly coated with the aqueous solution containing nickel.

Next, the amorphous semiconductor film coated with an aqueous solution containing nickel is crystallized by heat treatment, thereby forming a crystalline semiconductor film. As the heat treatment, a heating furnace, laser irradiation, irradiation with light from a lamp instead of a laser beam (hereinafter referred to as lamp annealing), or a combination thereof can be used.

Here, two heat treatments are combined. First, a first heat treatment is carried out by thermal crystallization using RTA at 650° C. for 6 minutes. Then, a second heat treatment is carried out by laser irradiation with UV laser having a wavelength of 308 nm. The second heat treatment by laser irradiation makes it possible to increase crystallinity of the crystalline semiconductor film.

Next, nickel (catalytic element) in the obtained crystalline semiconductor film is gettered. Nickel in the crystalline semiconductor film can be removed by gettering.

First, an amorphous semiconductor film containing argon for gettering is formed to a thickness of 30 nm by plasma CVD on the obtained crystalline semiconductor film. In this embodiment mode, argon is added to the amorphous semiconductor film for gettering; however, it is not limited thereto, and a rare gas element, for example, an element such as helium (He), neon (Ne), krypton (Kr), or xenon (Xe) may be added instead.

The amorphous semiconductor film for gettering may be formed to a thickness in the range of 20 nm to 250 nm by a known method such as LPCVD or sputtering without limitation to plasma CVD.

Next, heat treatment by thermal crystallization using RTA is carried out at 650° C. for three minutes, thereby gettering nickel (catalytic element) in the crystalline semiconductor film to the amorphous semiconductor film for gettering. Note that, heat treatment for gettering may be carried out using a known heating method such as a method using a heating furnace, laser irradiation, or furnace annealing other than a thermal crystallization method using RTA at 400° C. to 1000° C.

Further, also before forming the amorphous semiconductor film for gettering, heat treatment may be carried out. By carrying out a heat treatment before forming the amorphous semiconductor film for gettering, warpage of the crystalline semiconductor film can be reduced. Thus, nickel (catalytic element) can be easily gettered in the gettering.

Next, the amorphous semiconductor film for gettering is removed by selective etching. The etching may be performed by dry etching using $ClF_3$ without using plasma, wet etching using an alkali solution such as an aqueous solution containing hydrofluoric acid, hydrazine, or tetramethylammonium hydroxide (($CH_3)_4NOH$), or the like.

Next, in order to control a threshold value of a TFT, the crystalline semiconductor film may be doped with a slight amount of impurity element (boron or phosphorus). For example, in the case of manufacturing a p-channel TFT, the crystalline semiconductor film may be doped with a slight amount of an impurity element (boron) by ion doping using plasma excited diborane ($B_2H_6$) without mass separation.

Next, the oxide film on the surface of the crystalline semiconductor film is removed with an etchant containing hydrofluoric acid, and the surface of the crystalline semiconductor film is washed simultaneously. Further, a first resist mask is formed over the crystalline semiconductor film, and patterned into a desired shape using the first resist mask, thereby forming the semiconductor layers 502 to 505.

Next, a gate insulating film 506 is formed to cover the semiconductor layers 502 to 505. The gate insulating film 506 is formed to a thickness of 1 nm to 200 nm by plasma CVD or sputtering. Further, the gate insulating film may be formed thinly to a film thickness of 10 nm to 50 nm by first forming a single layer or a layered structure including insulating films containing silicon, and by forming surface nitriding by a plasma treatment using a microwave. In this embodiment mode, a silicon oxide film is formed to a thickness of 80 nm by plasma CVD using MOS (Tetra-Ethyl-Ortho-Silicate) as a reactive gas.

Next, a gate electrode is formed. First, a stack of a first conductive layer and a second conductive layer is formed over the gate insulating film 506. The first conductive layer and the second conductive layer are formed by a known method such as sputtering or vapor deposition. Further, the first conductive layer is formed to a film thickness of 10 nm to 100 nm, and the second conductive layer is formed to a film thickness of 100 nm to 600 nm. In this embodiment mode, a stack of a tantalum nitride film with a thickness of 370 nm and a tungsten film with a thickness of 30 nm in order are formed over the gate insulating film 50; thus, gate electrodes and wirings of TFTs are formed.

A stack of a nitride tantalum film and a tungsten film is used for the conductive layer; however, it is not limited thereto, and a high melting point metal such as tungsten (W), chromium (Cr), tantalum (Ta), nitride tantalum (TaN), or molybdenum (Mo) or an alloy or a compound containing such high melting point metal as a main component, or the like may be used as the conductive material. Further without limitation to the two-layered structure, for example, a three-layered structure including a 50 nm thick tungsten film, a 500 nm thick alloy (Al— Si) film of aluminum and silicon, and a 30 nm thick titanium nitride film which are stacked in order may be used.

It is preferable to use ICP (Inductively Coupled Plasma) etching for etching the first conductive layer and the second conductive layer (a first etching treatment and a second etching treatment). The layers can be etched into a desired taper shape by ICP etching and adjusting etching conditions as appropriate (power applied to a coiled electrode, power applied to an electrode on the substrate side, the temperature of the electrode on the substrate side, and the like).

Next, second resist masks 507a, 507b, 507c, and 507d, 507e, and 508f are formed over the second conductive layer. At that time, the second resist mask 507a is formed above the second conductive layer where a first gate electrode of a driving TFT is to be formed later, and the second resist mask 507b is formed over the second conductive layer where a second gate electrode of the driving TFT is to be formed later. The second resist mask 507a is formed so as to be larger than the second resist mask 507b.

Next, a first etching treatment and a second etching treatment are carried out using the second resist masks 507a to 507f. The first etching treatment is carried out under a first etching condition and a second etching condition, and the second etching treatment is carried out under a third etching condition and a fourth etching condition. The first to fourth etching conditions may be set as appropriate; however, in order to improve the etching rate, a dry etching device using a high density plasma source of ECR (Electron Cyclotron Resonance) or ICP (Inductively Coupled Plasma: inductively coupling plasma) or the like can be used.

In this embodiment mode, the first etching condition includes applying an RF (13.56 MHz) power of 700 W to a coiled electrode at a pressure of 1 Pa, using $CF_4$, $Cl_2$, and $O_2$ for an etching gas, and setting the gas flow rate thereof to 25:25:10 (sccm). The substrate side (sample stage) also receives an RF power of 150 W (13.56 MHz) to apply a substantially negative self-bias voltage. The area (size) of the substrate side electrode is 12.5 cm×12.5 cm and the coiled electrode is a disc which is 25 cm in diameter (here, a quartz disc provided with a coil). A W film which is the second conductive layer is etched under the first etching condition to make the end portion tapered. After that, the first etching conditions are switched to the second etching conditions without removing the resist masks 507a to 507g. The second etching conditions include using $CF_4$ and $Cl_2$ for an etching gas, setting the gas flow rate thereof to 30:30 (sccm), and giving an RF (13.56 MHz) power of 500 W to a coiled electrode at a pressure of 1 Pa to generate plasma for etching for about 30 seconds. The substrate side (sample stage) also receives an RF power of 20 W (13.56 MHz) to apply a substantially negative self-bias voltage. Under the second etching conditions where a mixture of $CF_4$ and $Cl_2$ is used, a tungsten film which is the second conductive layer and the tantalum nitride film which is the first conductive layer are etched to almost the same degree. FIG. 5B shows a cross sectional view of a state where the first etching treatment is finished. First conductive layers at this stage are denoted by 508a, 508b, 508c, 508d, 508e, and 508f and second conductive layers at this stage are denoted by 509a, 509b, 509c, 509d, 509e, and 509f.

Next, the second etching treatment is conducted with the second resist masks 507a to 507f left. The third etching conditions include using $CF_4$ and $Cl_2$ for an etching gas, setting the gas flow rate ratio thereof to 30:30 (sccm), and giving an RF (13.56 MHz) power of 500 W to a coiled electrode at a pressure of 1 Pa to generate plasma for etching for 60 seconds. The substrate side (sample stage) also receives an RF power of 20 W (13.56 MHz) to apply a substantially negative self-bias voltage. Then, the third etching conditions are switched to the fourth etching conditions without removing the second resist masks. The fourth etching conditions include using $CF_4$, $Cl_2$, and $O_2$ for an etching gas, setting the gas flow rate ratio thereof to 20:20:20 (sccm), and giving an RF (13.56 MHz) power of 500 W to a coiled electrode at a pressure of 1 Pa to generate plasma for etching for about 20 seconds. The substrate side (sample stage) also receives an RF power of 20 W (13.56 MHz) to apply a substantially negative self-bias voltage.

A cross sectional view of a state where the second etching treatment is finished is shown in FIG. 5C. In this stage, gate electrodes 512a, 512b, 512c, 512d, 512e, and 512f in which first conductive layers 510a, 510b, 510c, 510d, 510e, and 510f are lower layers, and second conductive layers 511a, 511b, 511c, 511d, 511e, and 511f are upper layers, and wirings are formed. Further, in a terminal area, terminal electrodes in which the first conductive layers are lower layers, and the second conductive layers are upper layers are formed.

Next, after the second resist masks 507a to 507f are removed, a first doping treatment in which an impurity element which imparts n-type conductivity (an element of Group XV in the periodic table such as phosphorus or arsenic) is added to the whole surface of the semiconductor layers 502 to 505 using the gate electrodes 512a to 512f as masks is carried out. The first doping treatment may be carried out by ion doping or ion implantation. The conditions of the ion doping include a dose amount of $1.5 \times 10^{13}$ atoms/cm$^2$, an accelerating voltage of 50 kV to 100 kV. As the impurity element which imparts n-type conductivity, phosphorus (P) or arsenic (As) is typically used. Doping is conducted through the gate insulating film 506 in this first doping treatment, thereby forming a first impurity region 513 (n$^-$ region) in a self-aligned manner.

Then, after forming third resist masks 514a to 514d, a second doping treatment is carried out for doping the semiconductor layer with an impurity element at high concentration that imparts n-type conductivity. The third resist masks 514a to 514d are provided in order to protect a channel region of the semiconductor layer 502 for forming a driving TFT (p-channel) in a pixel area and a peripheral region thereat and a channel region of the semiconductor layer 505 for forming a switching TFT (n-channel) in a driver circuit area and a peripheral region thereof.

Conditions of the ion doping method for the second doping treatment include a dose of $1 \times 10^{13}$/cm$^2$ to $5 \times 10^{15}$/cm$^2$ and an accelerating voltage of 60 kV to 100 kV. Through this doping treatment, a second impurity region (n$^+$ region) 515 and a third impurity region (n$^-$ region) 516 are formed. The second impurity region 515 includes a high concentration of an n-type impurity which is added through the gate insulating film 506, and the third impurity region (n$^-$ region) 516 is formed by doping through the first conductive layer 510 and the gate insulating film 506, and is overlapped with the first conductive layer 510. The n-channel TFT of the pixel area is partially covered with a mask, and thus, the first impurity region (n$^-$ region) 516, which is not overlapped with the gate electrode (first conductive layer 510), is formed between a channel region and the second impurity region 515. In addition, in the n-channel TFT of the driver circuit area, doping is carried out in a self aligned manner, so that a boundary between the third impurity region 516 and the second impurity region 515 is almost aligned with an end portion of the first conductive layer 510.

Then, after removing the third resist masks 514a to 514d, a fourth resist mask 517 is newly formed, and a third doping treatment for doping the semiconductor layer with an impurity element imparting p-type conductivity (an element of Group XIII of the periodic table such as boron) at high concentration is conducted. The fourth resist mask 517 is provided to protect a channel region of a semiconductor layer 503 forming an n-channel (switching) TFT of the pixel area, and the periphery thereof, and a channel region of a semiconductor layer 504 forming an n-channel TFT in a driver circuit area and the periphery thereof.

Through the third doping process, the fourth impurity regions 518, 519, 520, 521, and 522 (p$^+$ regions) doped through the gate insulating film 506 to contain a p-type impurity at high concentration, fifth impurity regions 523a, 523b, 524a, 524b, 525a, and 525b (P$^-$ regions) doped through the first conductive layer 510 and the gate insulating film 506 and overlap with the first conductive layer 510 are formed. The fourth impurity regions 518 to 522, and the fifth impurity regions 523a, 523b, 524a, 524b, 525a, and 525b are regions added with phosphorus (P) in the former first doping process (n$^-$ regions); however, the concentration of the impurity element imparting p-type conductivity is 1.5 to 3 times as much as the concentration; thus, the conductivity type of the regions is p-type.

Further, each boundary between the fifth impurity region and the fourth impurity region which overlaps with the first conductive layer 510a, 510b, or 510f is almost aligned to an end portion of the first conductive layer. Specifically, for example, the boundary between the fifth impurity region 523a and the fourth impurity region 518 is almost aligned with an end portion of the first conductive layer 510a. In addition, a boundary between a fifth impurity region and a channel region which overlaps with the second conductive layer 511a, 511b, or 511f is almost aligned with an end portion of the second conductive layer. Specifically, for example, the boundary between the fifth impurity region 523a and the channel region 526 is almost aligned with an end portion of the second conductive layer 511a.

As described above, after the third doping process, the source region (fourth impurity region 520), the drain region (fourth impurity region 518), and the high concentration impurity region (fourth impurity region 519), the pair of LDD regions (fifth impurity regions 523a, 523b, 524a and 524b), the first channel region 527, and the second channel region 526 of a driving TFT having a TFT structure of the present invention.

In this embodiment mode, the first channel region 527 of a driving TFT is formed so that the channel length $L_1$ thereof is longer than the channel length $L_2$ of the second channel region 526. Further, the channel lengths $L_1$ is only required to have a length which does not cause a short channel effect. Specifically, the $L_1$ may be preferably in the range of 2 μm to 8 μm (typically 4 μm to 6 μm). Further, the channel length $L_2$ is 1 μm or more, and is shorter than $L_1$ by 0.5 μm or more. In addition, the channel width may be 1 μm to 50 μm (preferably 5 μm to 30 μm). Here, the channel length $L_2$ is 3.5 μm and the channel length $L_2$ is 1.5 μm, and the channel width of the channel width is 25 μm.

The size (shape) of the first conductive layers 511a and 511b is necessarily deigned so that between the channel length $L_1$ of the first channel region 111 and $L_2$ of the second channel region 112, the relational expression $L_1 > L_2$ (preferably $3 \times L_1 \geq 5 \times L_2$, more preferably $L_1 \geq 2 \times L_2$) holds.

Next, the fourth resist mask 517 is removed. Through the above process, impurity regions having n-type or p-type conductivity type are formed partially in the semiconductor layers 502 to 505 of the TFTs formed in the pixel area and the driver circuit area, Next an interlayer insulating film is formed. An inorganic insulating film such as a silicon oxide film, a silicon nitride film, or a silicon oxynitride film; an organic resin film, or a film containing siloxane can be used for the interlayer insulating film; such an insulating film can be used in a single layer of a plurality of layers including two or more layers. Siloxane is a material that has a skeletal structure formed from a bond of silicon (Si) and oxygen (O), where an organic group at least containing hydrogen (for example, an alkyl group or aromatic hydrocarbon) is used as a substituent. A fluoro group may be used as a substituent. Alternatively, an organic group at least containing hydrogen and a fluoro group may be used as substituents. Further, sputtering, LPCVD, plasma CVD, or the like is used in the case of forming the inorganic insulating film using an inorganic film, and a coating method is used to form an organic film containing siloxane.

In this embodiment mode, the interlayer insulating film has a three-layered structure including silicon oxynitride films having different composition ratios. As the first interlayer insulating film 528a, a silicon oxynitride film (composition ratio: Si=32%, O=59%, N=7%, H=2%) is formed to a thickness of 80 nm by plasma CVD using $SiH_4$ and $N_2O$ as a reactive gas. Subsequently, for a second interlayer insulating film 528b, a silicon oxynitride film (composition ratio: Si=32%, O=27%, N=24%, H=17%) is formed to a thickness of 140 nm by plasma CVD using $SiH_4$, $NH_3$, and $N_2O$ as a reactive gas. Next, for a third interlayer insulating film 528c, a silicon nitride oxide film (composition ratio: Si=32%, O=59%, N=7%, H=2%) is formed to a thickness of 670 nm by plasma CVD using $SiH_4$ and $N_2O$ as a reactive gas. Note that in this embodiment mode, the interlayer insulating film has a layered structure of a three-layered structure; however, a single layer or a two-layered structure may be used; alternatively, a layered structure including 4 or more layers may be used. In addition, the film thickness of the first interlayer insulating film 528a is 50 nm to 150 nm (preferably 70 nm to 100 nm), the film thickness of the second interlayer insulating film 528b is 100 nm to 200 nm (preferably 130 nm to 160 nm), film thickness of the third interlayer insulating film 528c is 600 nm to 800 nm (preferably 650 nm to 750 nm).

Subsequently, a fifth resist mask is formed over the interlayer insulating film (third interlayer insulating film 528c), the interlayer insulating films 528a to 528c are selectively etched to form contact holes reaching each of the semiconductor layers 502 to 505. Further, the fifth resist mask is removed.

Next, after a metal film is stacked by sputtering; the sixth resist mask is formed; the stacked metal film is selectively etched; thus, electrodes 529, 530, 531, 532, 533, 534, 535, and 536 serving as a source electrode or a drain electrode of TFTs are formed. Further, an electrode 560 to be a terminal electrode simultaneously formed in a terminal area. In this embodiment mode, the metal film has a three-layered structure of a Ti film, an Al film, and a Ti film. Specifically, a 100 nm thick Ti film, a 700 nm thick Al film, and a 100 nm thick Ti film are sequentially formed in one metal sputtering device. Note that, the metal film may have a single layer or two layers; alternatively, a layered structure of 4 layers or more may be used, the total thickness of the stack may be 500 nm to 2 μm (preferably 800 nm to 1 μm). An electrode 530 formed here is to be a source electrode of a driving TFT, an electrode 529 is to be a drain electrode of the driving TFT. After that, the sixth resist mask is removed.

Note that in this process of forming an electrode, a sixth resist mask may be formed using a negative resist. Area of the negative resist which is irradiated with light, electrons, or ion energy radiation (electrode pattern) is cured, and after development, the area which is not irradiated is melted and removed. Specifically, the exposed area is left as a resist pattern (electrode pattern). Therefore, even in the case where foreign matter or the like is in an undesirable area (for example, where a pixel electrode is to be formed), defects in which the metal film is left unetched due to such foreign matter or the like can be reduced. Note that the present invention is not limited thereto and the positive resist may be formed using the sixth resist mask.

Through the steps above, a driving TFT 537 provided in the pixel area, a switching TFT 538, an n-channel TFT 539 provided in the driver circuit area, and a p-channel TFT 540 are manufactured over, one substrate. Note that, in this embodiment mode, TFT having a multigate structure of the present invention is applied to the driving TFT 537.

Note that, in this embodiment mode, the driving TFT 537 formed in the pixel area is a p-channel TFT including two gate electrodes and two channel regions connected in series; however, it is not limited thereto, and an n-channel TFT may be used instead. Further, in the driving TFT 537, the first channel region 527 is larger than the second channel region 526 as described above.

In addition, in this embodiment mode, the driving TFT 537 is a TFT having LDD region which overlap with the gate electrode; however, it is not limited thereto, and a TFT which does not have an LDD region may be used instead.

Further, in this embodiment mode, switching TFT 538 provided in the pixel area is an n-channel TFT including two gate electrodes and two channel regions connected in series, it is not limited thereto, and a single gate TFT, a multigate TFT having three or more gate electrodes may be used instead. Further, p-channel TFT may be used without limitation to an n-channel TFT.

Further, in this embodiment mode, the switching TFT 538 is a TFT having LDD regions which do not overlap with the gate electrode; however, a TFT which does not have LDD regions may be used without limitation thereto.

In addition, the n-channel TFT 539 that is placed in a driver circuit area 552 is an n-channel TFT with an LDD region overlapping with the gate electrode, and the TFT 540 is a p-channel TFT including an LDD region overlapping with the gate electrode. The both TFTs 539 and 540 have a single-gate structure. In the driver circuit area, complementary connection between the n-channel TFT 539 and the p-channel TFT 540 allows a CMOS circuit to be made up, and allows various kinds of circuits to be achieved. Alternatively, the TFTs 539 and 540 may be multigate TFTs if necessary.

Then, a first electrode 541 (an anode or a cathode of an organic light-emitting element) is formed. Further, an electrode 561 later to be a terminal electrode is formed simultaneously. As the first electrode 541, a material that has a large work function, for example, an element selected from nickel (Ni), tungsten (W), chromium (Cr), platinum (Pt), zinc (Zn), tin (Sn), indium (In) or molybdenum (Mo), or an alloy material including the metal element as its main component, for example, titanium nitride (TiN), titanium silicon nitride (TiSi$_x$N$_y$), tungsten silicide (WSi$_x$), tungsten nitride (WN$_x$), tungsten silicide nitride (WSi$_x$N$_y$), or niobium nitride (NbN) may be used to form a single layer film or a film of stacked layers with the total film thickness in the range of 100 nm to 800 nm.

Specifically, as the first electrode 541 and the electrode 561, a transparent conductive layer formed of a light-transmitting conductive material may be used, and an indium oxide containing tungsten oxide, an indium zinc oxide containing tungsten oxide, an indium oxide containing titanium oxide, an indium tin oxide containing titanium oxide, or the like can be used. Naturally, indium tin oxide (ITO), indium zinc oxide (IZO), and indium tin oxide doped with a silicon oxide (ITSO), or the like can be also used.

In addition, examples of the composition ratios of each light-transmitting conductive material will be described. The composition ratio of the indium oxide containing tungsten oxide may be 1.0 wt % of tungsten oxide and 99.0 wt % of indium oxide. The composition ratio of the indium zinc oxide containing tungsten oxide may be 1.0 wt % of tungsten oxide, 0.5 wt % of zinc oxide, and 98.5 wt % of indium oxide. The composition ratio of the indium oxide containing titanium oxide may be 1.0 wt % to 5.0 wt % of titanium oxide and 99.0 wt % to 95.0 wt % of indium oxide. The composition ratio of the indium tin oxide (ITO) may be 10.0 wt % of tin oxide and 90.0 wt % of indium oxide. The composition ratio of the indium zinc oxide (IZO) may be 10.7 wt % of zinc oxide and 89.3 wt % of indium oxide. The composition ratio of the indium tin oxide containing titanium oxide may be 5.0 wt % of titanium oxide, 10.0 wt % of tin oxide, and 85.0 wt % of indium oxide. The composition ratios described above are examples, and the percentages of the composition ratios may be set as appropriate.

Then, an insulating film (for example, an organic resin film) is formed by coating and the obtained insulating film is patterned to form an insulator 542 (referred to as a bank, partition, barrier, or embankment) covering an end of the first electrode 541.

Then, a layer 543 containing an organic compound is formed by vapor deposition, coating, or the like.

The layer 543 containing an organic compound has a layered structure, and a buffer layer may be used as one layer of the layer 543 containing an organic compound. The buffer layer is a composite material layer containing an organic compound and an inorganic compound, and the inorganic compound exhibits an electron accepting property with respect to the organic compound. The buffer layer is a composite material layer containing an organic compound and an inorganic compound, and the inorganic compound has one or more selected from the group consisting of a titanium oxide, a zirconium oxide, a hafnium oxide, a vanadium oxide, a niobium oxide, a tantalum oxide, a chromium oxide, a molybdenum oxide, a tungsten oxide, a manganese oxide, and/or a rhenium oxide. The buffer layer is a composite material layer including a hole transporting organic compound and an inorganic compound.

For example, it is preferable to provide a stack containing an organic compound (stack of the buffer layer and an organic compound layer) between the first electrode 541 and a second electrode. The buffer layer is a composite layer including a metal oxide (such as a molybdenum oxide, a tungsten oxide, or rhenium oxide) and an organic compound (a hole transporting material, for example, 4,4'-bis[N-(3-methylphenyl)-N-phenylamino]-biphenyl (abbreviated to: TPD), 4,4'-bis[N-(1-naphthyl)-N-phenylamino]-biphenyl (abbreviated to: α-NPD), 4,4'-bis{N-[4-(N,N-di-m-tolylamino)phenyl]-N-phenylamino}biphenyl (abbreviated to: DNTPD), or the like). In addition, for the layer 543 containing an organic compound, for example, tris(8-quinolinolato)aluminum (abbreviated to: Alq$_3$), tris(4-methyl-8-quinolinolato)aluminum (abbreviated to: Almq$_3$), α-NPD, and the like can be used. In addition, the layer 543 containing an organic compound may include a dopant material, and for example, N,N'-dimethylquinacridone (abbreviated to: DMQd), coumarin 6, rubrene, and the like can be used. The layer 543 provided between the first electrode and the second electrode may be formed by evaporation such as resistance heating.

By adjusting the film thickness of the buffer layer, distance between the first electrode 541 and the layer 543 containing an organic compound can be controlled to improve the luminous efficiency. By adjusting the film thickness of the buffer layer, a light-emitting device that is capable of displaying excellent images with the clear luminescent color from each light-emitting element can be achieved with lower power consumption.

Then, a second electrode 544 (a cathode or an anode of the organic light-emitting element) is formed. As the second electrode 544, an alloy such as MgAg, MgIn, or AlLi, or a transparent conductive layer (such as an ITO) is used.

Then, a protective layer 545 is formed by vapor deposition or sputtering using a mask. The protective layer 545 protects the second electrode 544. When light is extracted from the light-emitting element through the protective layer 545, it is preferable that the protective layer 545 be formed of a transparent material. The protective layer 545 is not required to be provided if unnecessary.

Then, a sealing substrate 548 is attached using a sealing material 546 to carry out sealing for the light-emitting element, namely, in the light-emitting display device, the periphery of a display area is surrounded by the sealing material 546 to carry out sealing with the substrate 500 and the sealing substrates 548. In this embodiment mode, the sealing material 546 is provided at the terminal area; alternatively, it may be provided so as to partially overlap with the driver circuit area, or it may be provided in any manner as long as it surrounds the periphery of the display area. It is to be noted that the region surrounded by the sealing material 546 is filled with a filler 547. Alternatively, the region surrounded by the sealing material 546 is filled with a dry, inert gas.

Figure 7:
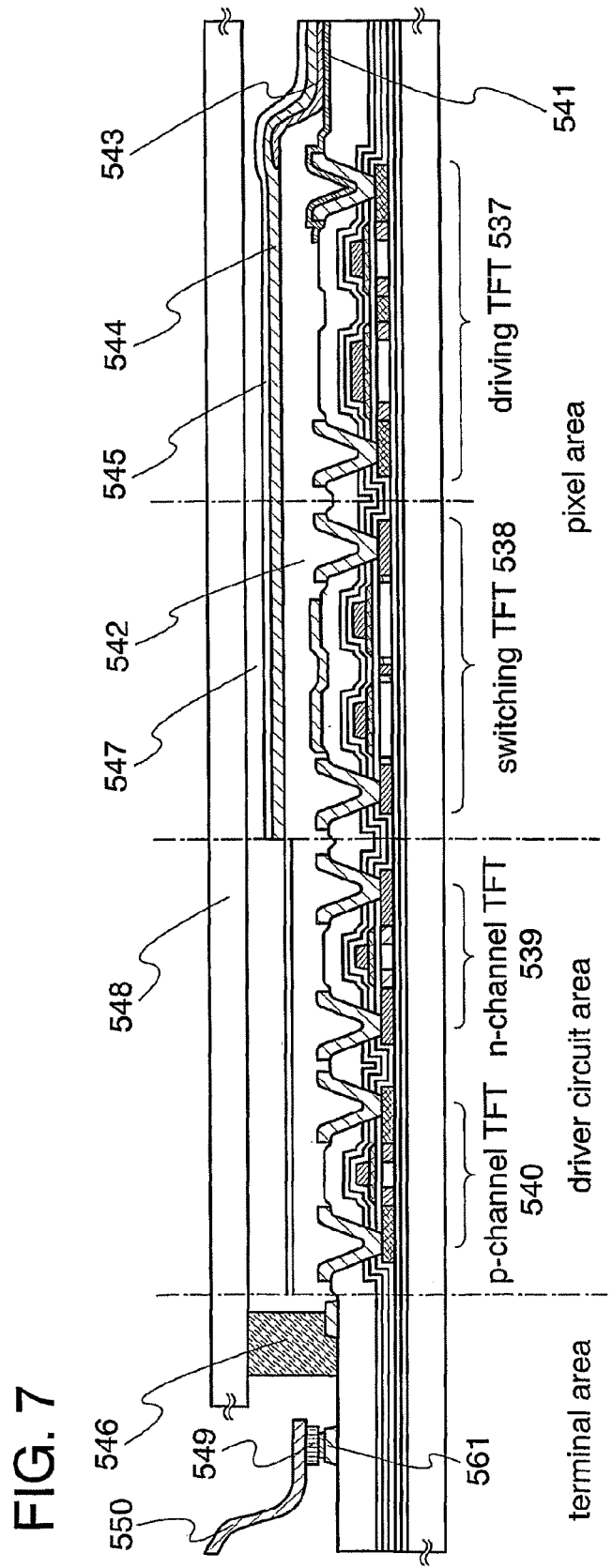
FIG. 7 is a show cross-sectional view illustrating an example of a light emitting device of the present invention.

Finally, an FPC 550 is attached to a terminal electrode in the terminal area 553 by a known method using an anisotropic conductive layer 549 (FIG. 7). It is to be noted that it is preferable that the electrode 561 that is obtained in the same steps as that for the first electrode 541 be used for the top layer of the terminal electrode, and the electrode 561 is formed on the electrode 560 formed at the same time as the source electrode or the drain electrode.

Figure 8:
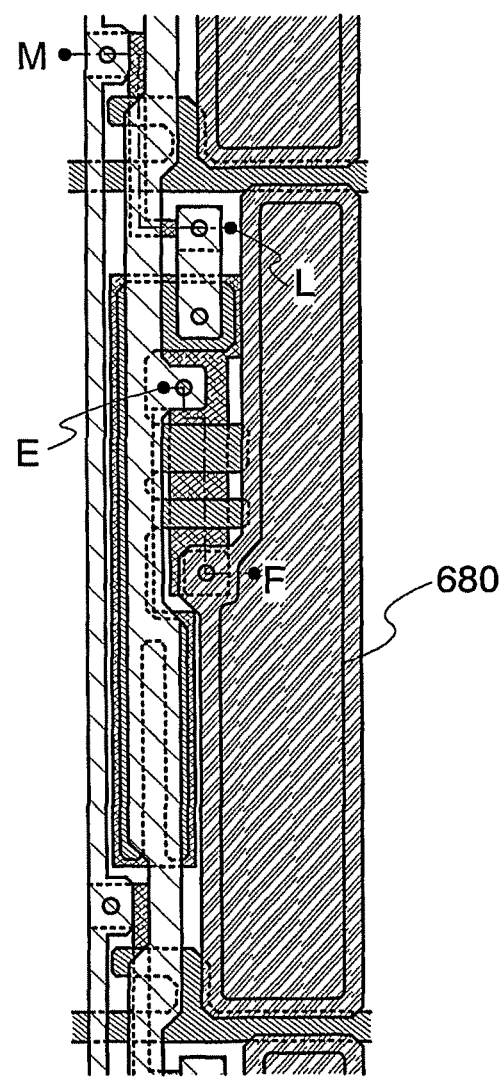
FIG. 8 is a top view of a pixel area in a light emitting device of the present invention.

In addition, FIG. 8 is a top view of the pixel area, and the cross section along the dashed line E-F in FIG. 8 corresponds to the cross section structure of the driving TFT 537 in the pixel area in FIG. 7. In addition, the cross section along the dashed line M-L in FIG. 8 corresponds to the cross section structure of the switching TFT 538 in the pixel area in FIG. 7. It is to be noted that the solid line denoted by reference numeral 680 in FIG. 8 shows a rim of the insulator 542. Note that only the second conductive layer is shown in FIG. 8, and the first conductive layer is not shown in the figure. FIGS. 7 and 8 illustrate examples of a light emitting device of the present invention; the wiring or the like are modified in accordance with the layout Through the above steps, the pixel area 551, the driver circuit area 552, and the terminal area 553 can be formed over one substrate.

In this embodiment mode, the driving TFT 537 and the switching TFT 538 in the pixel area have a multigate structure.

In addition, one or both sides of the light-emitting device may be light-emitting display surfaces. When the first electrode 541 and the second electrode 544 are formed using transparent conductive layers, light from the light-emitting element passes through both of the substrate 500 and the sealing substrate 548 and is extracted from the both sides. In this case, it is preferable to use transparent materials for the sealing substrate 548 and a filler 547.

When the second electrode 544 is formed of a metal film and the first electrode 541 is formed of a transparent conductive layer, a structure in which light from the light-emitting element transmits only the substrate 500 to be extracted light from one side, that is, bottom emission type is provided. In this case, it is unnecessary to use a transparent material for the sealing substrate 548 or the filler 547.

Further, the first electrode 541 is formed by using a metal film and the second electrode 544 be formed of a transparent conductive layer, a structure of transmitting light from the light-emitting element transmits the sealing substrate 548 to be to extracted from one side, that is, a top emission type is provided. In this case, it is unnecessary to use a transparent material for the substrate 500.

In addition, it is necessary that the materials for the first electrode 541 and the second electrode 544 be selected in consideration of work function. Note that both the first electrode 541 and the second electrode 544 can serve as an anode or a cathode depending on the pixel structure. When the polarity of the driving TFT 537 is a p-channel type, the first electrode 541 and the second electrode 544 are preferably an anode and a cathode, respectively. Alternatively, when the polarity of the driving TFT 537 is an n-channel type, the first electrode 541 and the second electrode 544 are preferably a cathode and an anode, respectively.

Figure 9:
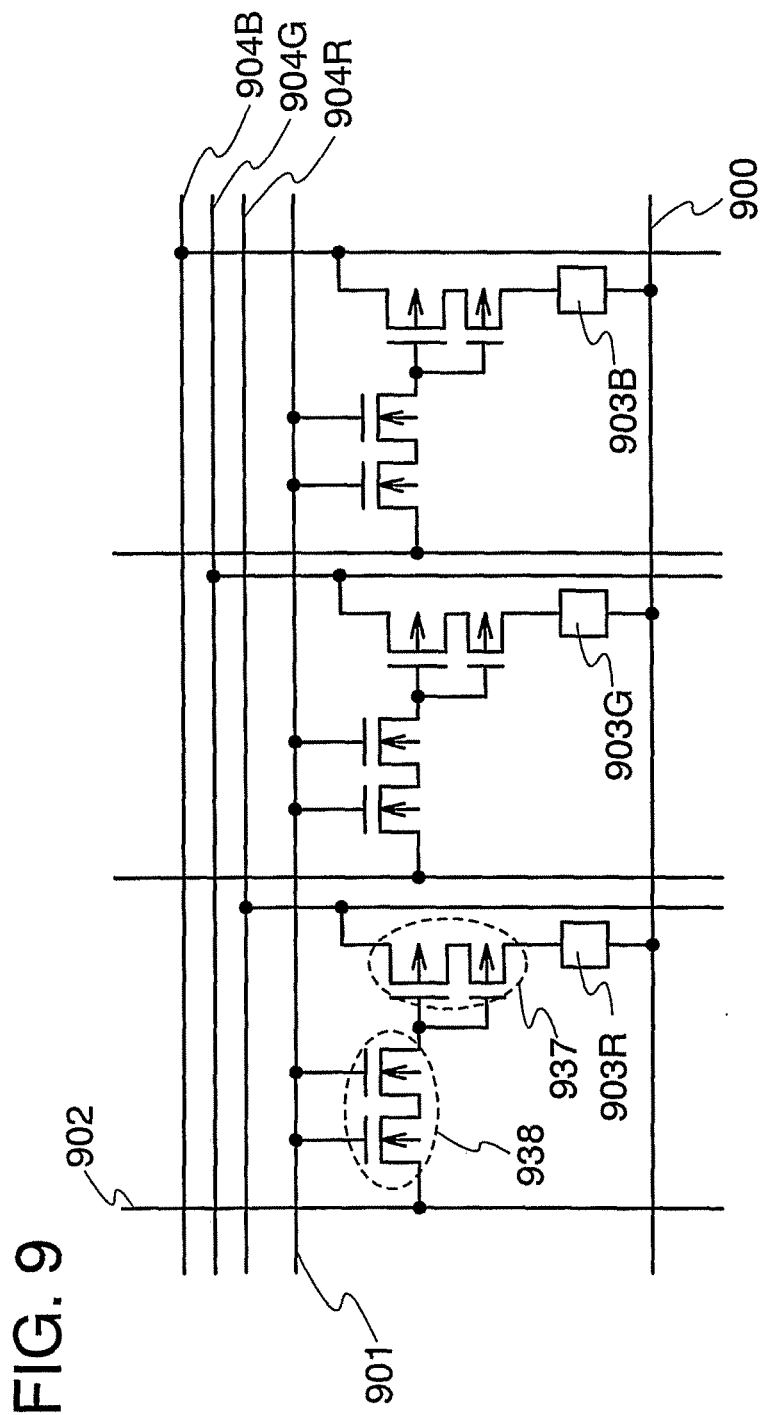
FIG. 9 is a figure illustrating an example of an equivalent circuit of a pixel area in a light emitting device.

In addition, as for the case of full color display, FIG. 9 shows an equivalent circuit diagram of a pixel area according to this embodiment mode. TFTs 938 and 937 in FIG. 9 correspond to the switching TFT 538 and the TFT 537, respectively. The TFT 938 is positioned in the vicinity of an intersection point of the gate wiring 901 and the source wiring 902. In a pixel for displaying a red color, a light emitting element 903R that produces red luminescence is connected to a drain region of the TFT 937, and an anode side power supply line (R) 904R is provided on a source region thereof. Further, a cathode side power supply line 904R is provided on the light emitting element 903R. In addition, in a pixel for displaying a green color, a light emitting element 903G that produces green luminescence is connected to a drain region of the TFT 937, and an anode side power supply line (G) 904G is provided on a source region thereof. In addition, in a pixel for displaying blue color, an OLED 903B that produces blue luminescence is connected to a drain region of the TFT 937, and an anode side power supply line (B) 904B is provided on a source region thereof. Different voltages are applied on each pixel for different colors depending on the EL materials.

In addition, in the light-emitting device, the driving method of the screen display is not particularly limited, and for example, a dot sequential driving method, a line sequential driving method, a field sequential driving method, or the like may be used. Typically, while employing a line sequential driving method, a time gray-scale driving method or an area gray-scale driving method may be used as appropriate. In addition, image signals that are input to source lines of the light-emitting device may be analog signals or digital signals, and the driver circuit or the like may be designed in accordance with the image signals as appropriate.

Further, in the light-emitting device using digital video signals, a video signal that is input to a pixel has a constant voltage (CV) or constant current (CC). When the video signal has constant voltage (CV), a signal that is applied to the light-emitting element has constant voltage (CVCV) or a constant current (CVCC). In addition, when the video signal has constant current (CC), a signal that is applied to the light-emitting element has constant voltage (CCCV) or constant current (CCCC).

In addition, in the light-emitting device, a protective circuit (such as a protective diode) for preventing electrostatic breakdown may be provided.

As described above, when a p-channel TFT having a multigate structure is applied to the driving TFT 537 of the light emitting device, characteristic defects of the driving TFT 537 (specifically, knot-like characteristic defects generated in a rising portion of an Id-Vg curve) can be prevented. Accordingly, "black blurring phenomenon" of the light emitting device can be reduced. The "black blurring phenomenon" includes a phenomenon in which current flows in an area for displaying black (where current is not supplied), and light is emitted. When "black blurring phenomenon" occurs in a light emitting device, black is not displayed properly in the display area. Therefore, color contrast, grayscale level, and color reproducibility are wholly affected significantly, and accurate image reproduction is hard to be achieved. By using a TFT having a multigate structure disclosed in this specification, a light emitting device in which color contrast, grayscale level, and color reproducibility are improved.

Embodiment Mode 5

In this embodiment mode, examples of another light emitting device and a manufacturing method thereof will be described with reference to FIG. 10. Note that this embodiment mode has the same structure and manufacturing method as Embodiment mode 4 including the steps up to the state shown in FIG. 6C, and the description will not be repeated.

Figure 10:
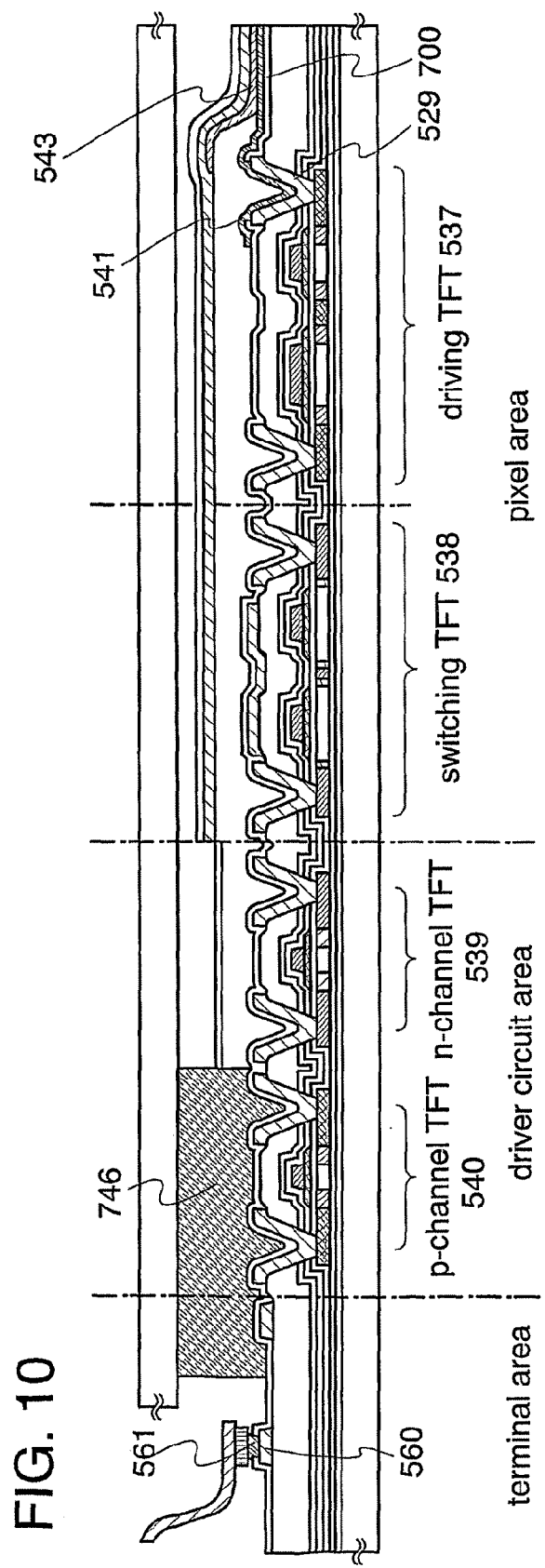
FIG. 10 is a show cross-sectional view illustrating an example of a light emitting device of the present invention.

In FIG. 10, electrodes 529 to 536 serving as source electrodes or drain electrodes, which are electrically connected to the semiconductor layers 502 to 505 with interlayer insulating films 528*a* to 528*c* therebetween; and an electrode 560 to be a terminal electrode are formed.

Next, a fourth interlayer insulating film 700 is formed over the third interlayer insulating film 528*c* and electrodes 529 to 536, and 560. For the fourth interlayer insulating film 700, an inorganic insulating film such as a silicon oxide film, a silicon nitride film, or a silicon oxynitride film can be used, and a single layer or a plurality of layers of the insulating films may be formed. Further, as the method forming such inorganic insulating film, sputtering, LPCVD, plasma CVD, or the like may be used.

In this embodiment mode, the fourth interlayer insulating film 700 is formed from an inorganic insulating film with a thickness of 100 nm to 150 nm by plasma CVD. The fourth interlayer insulating film 700 is formed to a thickness in the range of 50 nm to 500 nm (preferably 100 nm to 300 nm). When the fourth interlayer insulating film 700 formed from a thin inorganic insulating film shown in FIG. 10, a step due to a wiring or a residue generated when the wiring is formed can be covered, thereby preventing a short circuit. Thus, reliability of the light emitting device can be improved.

Next, a resist mask is formed over the fourth interlayer insulating film 700, and selective etching is carried out to form contact holes reaching the drain electrode 529 and the electrode 560 of the driving TFT are formed. Then, the resist mask is removed.

Next, a first electrode 541 and an electrode 561 to be a terminal electrode are formed. The following structure and manufacturing method of a light emitting device are the same as Embodiment Mode 4.

Further, in this embodiment mode, a sealing material 746 is provided so as to partially overlap with a driver circuit area. A region surrounded with the sealing material 746 may be filled with a filler, or may be filled with a dry inert gas. Note that, the sealing material 746 may be provided so as to surround the periphery of the display area, or may be provided only at the terminal area.

When the fourth interlayer insulating film 700 is formed as in this embodiment mode, TFTs, wirings, or the like the driver circuit area can be prevented from being exposed and can be protected.

Embodiment Mode 6

In this embodiment mode, examples of another light emitting device and a manufacturing method thereof will be described with reference to FIG. 11. Note that this embodiment mode is the same as Embodiment Mode 5 except for the structure and the manufacturing method of a second insulating film, and the description will not be repeated. In this embodiment mode, only a pixel area will be described.

Figure 11:
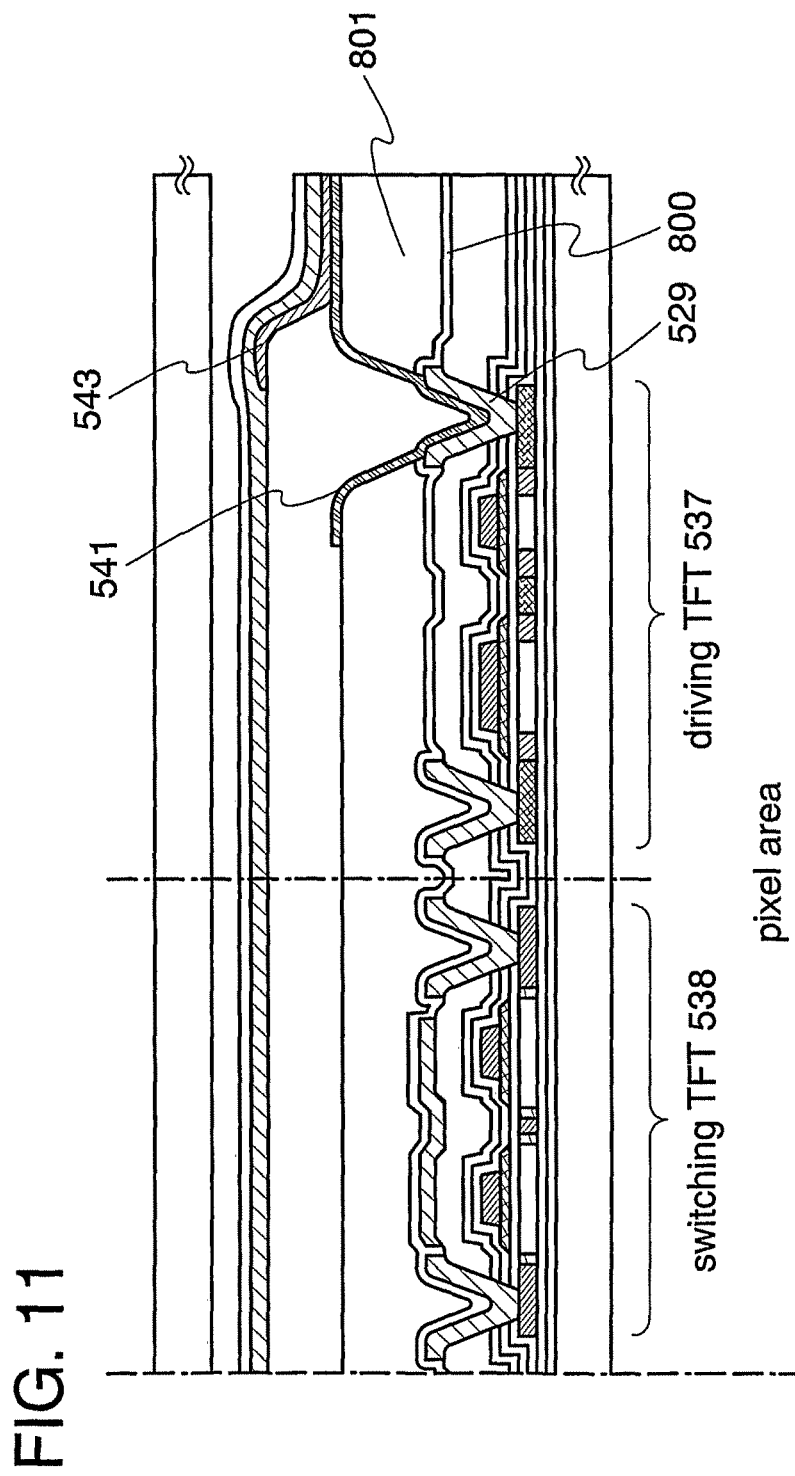
FIG. 11 is a cross-sectional view of a pixel area in a light emitting device of the present invention.

In FIG. 11, electrodes 529 to 536 serving as source electrodes or drain electrodes, which are electrically connected to the semiconductor layers 502 to 505 with interlayer insulating films 528*a* to 528*c* therebetween are formed.

Next, a fourth interlayer insulating film and a fifth interlayer insulating film are formed over the third interlayer insulating film 528*c* and electrodes 529 to 532. For the fourth interlayer insulating film 800, an inorganic insulating film such as a silicon oxide film, a silicon nitride film, or a silicon oxynitride film can be used. Such an inorganic insulating film may be formed by sputtering, LPCVD, plasma CVD, or the like. In addition, a plurality inorganic insulating layers may be used for the fourth interlayer insulating film 800.

Next, as the fifth interlayer insulating film 801, a film containing siloxane, a low-k organic resin film (a photosensitive or non-photosensitive organic resin film), or the like can be used, and the film may be formed by a coating method. Siloxane is a material that has a skeletal structure formed from a bond of silicon (Si) and oxygen (O), where an organic group including hydrogen (for example, an alkyl group or aromatic hydrocarbon) is used as a substituent. A fluoro group may be used as a substituent. Alternatively, an organic group and a fluoro group may be used as substituents.

The fifth interlayer insulating film 801 is provided on only the pixel area. Accordingly, only the fourth interlayer insulating film 800 is provided in the driver circuit area and the terminal area. Accordingly, the structure of the driver circuit area and the terminal area is the same as FIG. 10 (Embodiment Mode 4).

In this embodiment mode, a silicon oxynitride film is formed to 100 nm to 150 nm by plasma CVD for the fourth interlayer insulating film 800. As the fifth interlayer insulating film 801, a film containing siloxane is formed to 800 nm by a coating method. Note that, the film thickness of the fourth interlayer insulating film 800 may be in the range of 50 nm to 500 nm (preferably 100 nm to 300 nm). Further, the film thickness of the fifth interlayer insulating film 801 may be in the range of 500 nm to 1 μm (preferably 700 nm to 900 nm).

Next, a resist mask is formed over the fifth interlayer insulating film 801, and selective etching is carried out to form contact holes reaching the drain electrode 529 and the electrode 560 of the driving TFT are formed. Then, the resist mask is removed.

Next, a first electrode 541 is formed. The following structure and manufacturing method of a light emitting device are the same as Embodiment Mode 4 and Embodiment Mode 5.

When the fifth interlayer insulating film 801 is formed of a film containing siloxane or an organic resin film as in this embodiment mode, a step due to a TFT can be reduced. Since a layer 543 containing an organic compound is extremely thin, a light emission defect may occur due to the step. Therefore, it is very effective to planarize the first electrode 541 in advance so as to form the organic compound having layer 543 on a surface which is as flat as possible.

Embodiment Mode 7

Examples of mounting an FPC or a driver IC for driving on a light-emitting display panel will be described here with reference to FIGS. 12A and 12B.

Figure 12A:
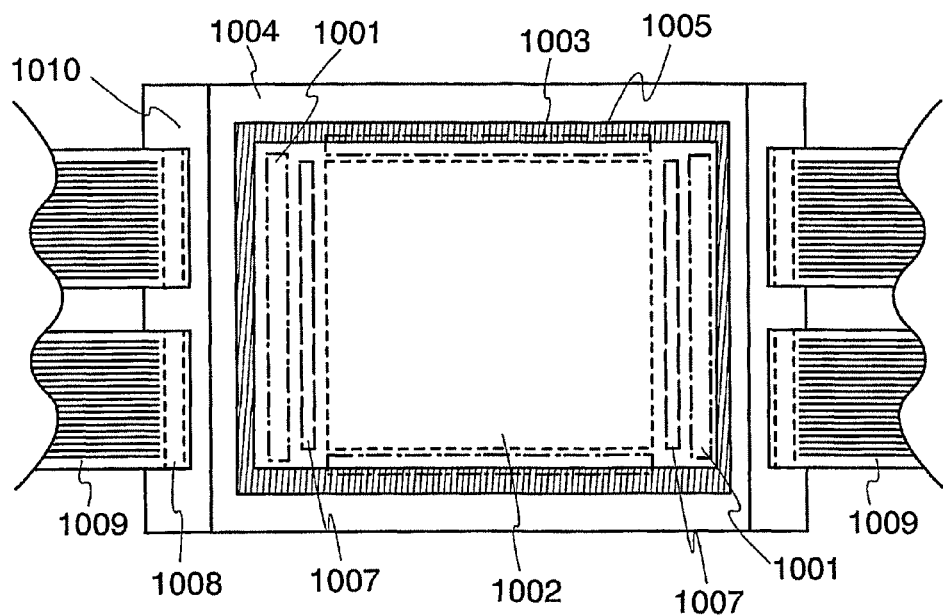
FIGS. 12A and 12B are diagrams illustrating examples of a module of the present invention.

The drawing shown in FIG. 12A shows an example of a top view of a light-emitting device that has FPCs 1009 attached to four terminal areas 1008. A pixel area 1002 including light-emitting elements and TFTs, a gate driver circuit 1003 including TFTs, and a first driver circuit 1001 including TFTs are formed on a substrate 1010. The active layers of the TFTs are constituted by semiconductor films having crystalline structures, and these circuits are formed on one substrate. Accordingly, an EL display panel achieving system-on-panel can be manufactured.

It is to be noted that the substrate 1010 is covered with a protective film except contact portions, and a base layer containing a material that has a photocatalytic function is provided on the protective film.

In addition, connection areas 1007 provided in two positions to sandwich the pixel area are provided for making a second electrode (cathode) of light-emitting elements to be in contact with a lower wiring. It is to be noted that first electrodes (anodes) of the light-emitting elements are electrically connected to the TFTs provided in the pixel area.

In addition, a sealing substrate 1004 is fixed to the substrate 1010 with a sealing material 1005 surrounding the pixel area and the driver circuits and a filler surrounded by the sealing material. Alternatively, the filler may contain a transparent desiccant. Alternatively, a desiccant may be provided in a region which does not overlap with the pixel area.

Note that, in this embodiment mode, the sealing material 1005 is provided so as to partially overlap with the gate driver circuit 1003 including the TFT; however, it is only required to surround the periphery of the display area. Specifically, the sealing material 1005 may be provided so as not to overlap the gate driver circuit 1003.

Figure 12B:
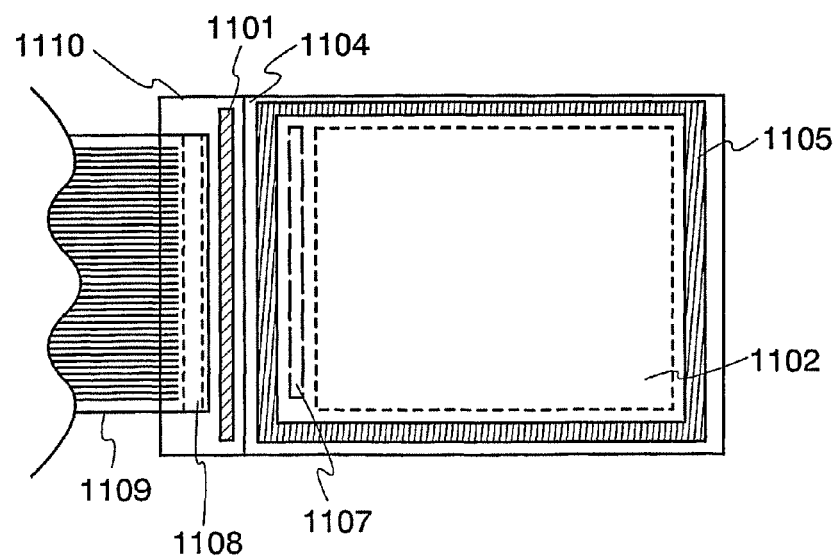

In addition, while the structure shown in FIG. 12A shows an example that is preferred in a relatively large-sized (for example, 4.3 inches diagonal) light-emitting device, FIG. 12B shows an example of employing a COG method that is preferred in a small size light-emitting device (for example, 1.5 inches diagonal) with a narrower circuit frame.

In FIG. 12B, a driver IC 1101 is provided on a substrate 1110, and an FPC 1309 is mounted on a terminal area 1308 placed beyond the driver IC. As for the driver IC 1101 that is mounted, in view of improving productivity, it is preferable to form a plurality of driver ICs on a rectangular substrate 300 mm to 1000 mm or more on a side, namely, a plurality of circuit patterns each including a driver circuit area and an input/output terminal as one unit can be formed on a substrate and finally divided to singulate driver ICs individually. As for the length of the longer side of the driver IC, the driver IC may be formed to have a rectangular shape with a longer side of 15 mm to 80 mm and a shorter side of 1 mm to 6 mm in consideration of the length of one side of the pixel area and the pixel pitch, or may be formed so that the longer side has a length equal to one side of the pixel region or a length that is obtained by adding one side of the pixel area and one side of each driver circuit.

As to the outside dimension, the driver IC has an advantage over an IC chip in the length of the longer side, the use of driver ICs formed to have longer sides of 15 mm to 80 mm requires a smaller number of driver ICs for mounting corresponding to the pixel areas than a case of using IC chips, and the yield in manufacturing can be therefore improved. In addition, when driver ICs are formed on a glass substrate, the productivity is not damaged since the driver ICs are not limited by the shape of the substrate that is used as a mother body. This is a great advantage as compared with a case of obtaining IC chips from a circular silicon wafer.

Alternatively, a TAB method may be employed, and in that case, driver ICs may be mounted on a plurality of tapes to be attached. In the same manner as in the case of the COG method, a single driver IC may be mounted on a single tape, and in this case, it is preferable to attach a metal piece or the like for fixing the driver IC in terms of the strength.

In addition, a connection area 1107 provided between the pixel area 1102 and the driver IC 1101 is provided for making second electrodes of light-emitting elements to be in contact with a lower wiring. It is to be noted that first electrodes of the light-emitting elements are electrically connected to the TFTs provided in the pixel area.

In addition, a sealing substrate 1104 is fixed to the substrate 1110 with a sealing material 1105 surrounding the pixel area 1102 and a filler surrounded by the sealing material.

When an amorphous semiconductor film is used as the active layers of the TFTs in a pixel area, the configuration in FIG. 12B is employed even in the case of a large size since it is difficult to form a driver circuit on the same substrate.

Further, in the case of using an amorphous semiconductor film as an active layer of a TFT in a pixel area, since it is difficult to form a driver circuit over the same substrate, the configuration of FIG. 12B is used even in larger size substrate.

Here, the connection area 1007 will be described with reference to FIG. 13. Since other structures than the connection area 1007 are the same as in Embodiment mode 4, Embodiment mode 5, or Embodiment mode 6, the descriptions will not be repeated.

Figure 13:
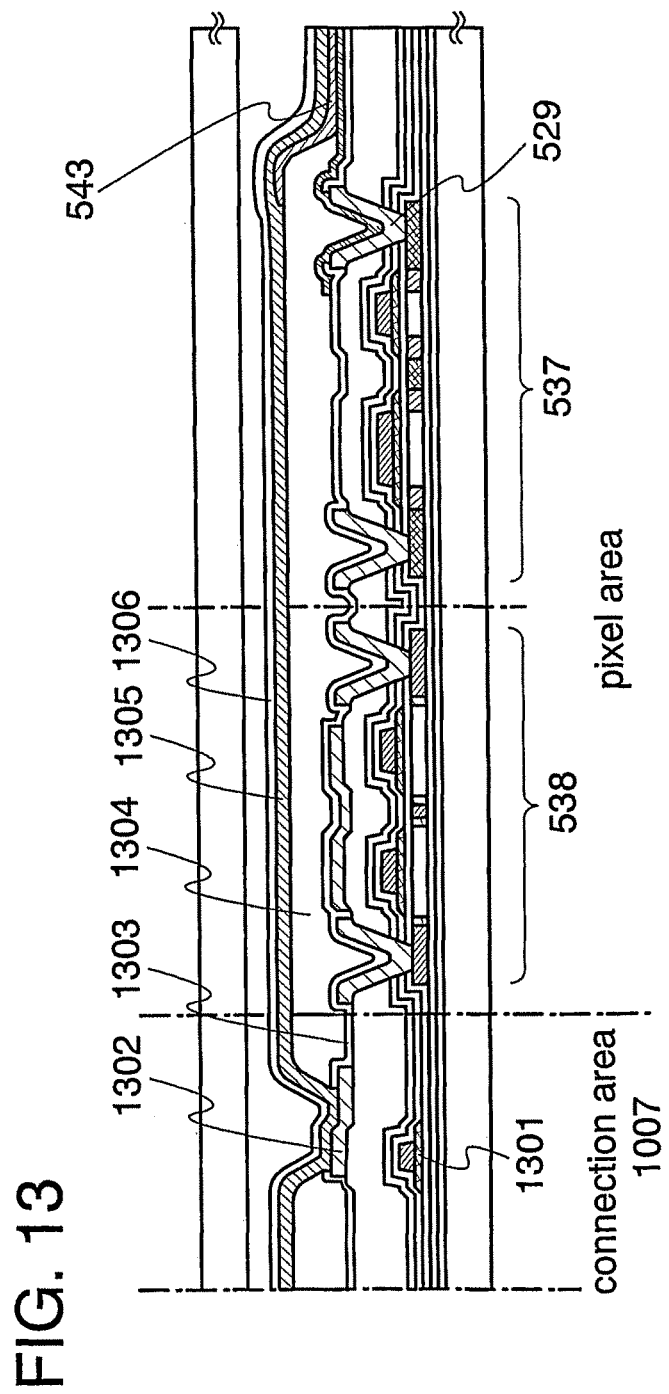
FIG. 13 is a cross-sectional view illustrating an example of a module of the present invention.

In FIG. 13, a conductive layer 1301 is formed of the same material as the gate electrode 512a to 512d in the connection area 1007.

Next, after the interlayer insulating films 528a to 528c are formed, a wiring 1302 is formed of the same material as the electrodes 529 to 532 which serve as source electrodes or drain electrodes.

Next, a fourth interlayer insulating film 1303 is formed over the third interlayer insulating film 528c and the wiring 1302. An inorganic insulating film such as a silicon oxide film, a silicon nitride film, or a silicon oxynitride film can be used as the fourth interlayer insulating film 1303, and single layer of a plurality of layers of such insulating films may be used. Further, as a method for forming an inorganic insulating film, sputtering, LPCVD, plasma CVD, or the like may be used. In addition, a film containing siloxane or a low-k organic resin film is formed over the inorganic insulating film by a coating method to have a layered structure. The fourth interlayer insulating film 1303 is not required to be provided if unnecessary.

Next, a resist mask is formed over the fourth interlayer insulating film 1303, and selective etching is carried out to form contact holes reaching the wiring. Then, the resist mask is removed.

Next, after a first electrode is formed in the pixel area, an insulating film (for example, an organic resin film) is formed by a coating method, and the obtained insulating film is patterned to form an insulator 1304 (referred to as a bank, a partition layer, a mound, or the like) which covers an end portion of the first electrode 541. At this time, the insulating film is patterned so as to expose the wiring 1302.

Next, after a layer 543 containing an organic compound is formed in the pixel area, a second electrode 1305 is formed. At this time, the wiring 1302 and the second electrode 1305 are electrically connected (contact) in the connection area 1007. As the second electrode 1305, an alloy such as MgAg, MgIn, or AlLi, or a transparent conductive layer (ITO or the like) may be used.

Next, a protective layer 1306 is formed over the second electrode 1305. In the case of obtaining light of a light-emitting device through the protective layer 1306, the second electrode is preferably formed of a transparent material. Note that the protective layer 1306 is not required if unnecessary. The structure and manufacturing method of the light emitting device are the same as in Embodiment Mode 4, Embodiment Mode 5, or Embodiment Mode 6.

Note that the connection area 1107 is also similar to the connection area 1007.

Although an example of an active matrix light-emitting device is shown here as a display device, the present invention can be naturally applied to an active matrix liquid crystal display device. In an active matrix liquid crystal display device, display patterns are formed on a screen by driving pixel electrodes arranged in matrix. Specifically, by applying a voltage between a selected pixel electrode and a counter electrode corresponding to the pixel electrode, a liquid crystal layer disposed between the pixel electrode provided on an element substrate and the counter electrode provided on a counter substrate is optically modulated, and this optical modulation is recognized as display patterns by viewers. The counter substrate and the element substrate are equally spaced, and the space is filled with a liquid crystal material. As for the liquid crystal material, a method of dropping the liquid crystal with the sealing material to form a closed pattern under reduced pressure so as to prevent bubbles mixed therein and attaching the both substrates may be used, or a dip method (a pumping method) of providing a sealing pattern having an opening, attaching the TFT substrate, and then introducing the liquid crystal by capillary action may be used.

In addition, the present invention can be applied also to a liquid crystal display device using a field sequential driving method of using optical shutters without using color filters and making back light sources for three colors of RGB flash at high speeds.

As described above, various electronic devices can be completed using the manufacturing method or structure in any one of Embodiment Modes 1 to 4.

Embodiment Mode 8

Semiconductor devices and electronic devices according to the present invention include a camera such as a video camera or a digital camera, a goggle-type display (a head mounted display), a navigation system, a sound reproduction system (such as a car audio system, audio components), a laptop personal computer, a game machine, a personal digital assistant (such as a mobile computer, a cellular phone, a portable game machine, or an electronic book), and an image reproduction system provided with a recording medium (specifically, a system provided with a display that can reproduce content of a recording medium such as a Digital Versatile Disc (DVD) and display the image). FIGS. 14A to 14D and FIG. 15 show specific examples of those electronic devices.

Figure 14A:
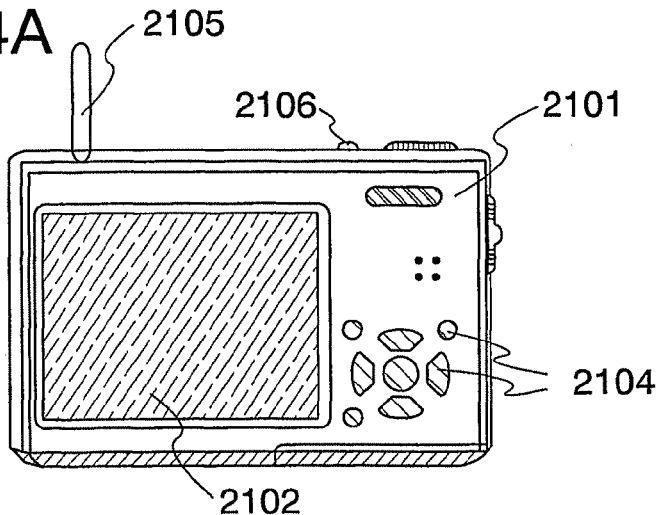
FIGS. 14A to 14D are figures illustrating examples of electronic devices.

FIG. 14A is a digital camera, which includes a main body 2101, a display area 2102, an imaging portion, operation keys 2104, a shutter 2106, and the like. FIG. 14A is a figure of the digital camera as seen from the display area 2102 side, and the imaging portion is not shown.

Further, as to the digital camera of the present invention, signals of image signals, audio signals, or the like are received with the antenna 2105; thus, the display area 2102 may be operated as a display medium of a television receiver or the like. In the case where the display area 2102 is used as a display medium such as a television device, a speaker, operation switches, or the like may be provided as appropriate. The present invention makes it possible to achieve highly reliable digital camera having a high-definition display area.

Figure 14B:
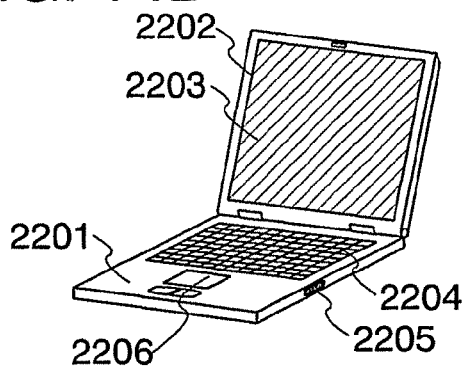

FIG. 14B is a laptop personal computer, which includes a main body 2201, a housing 2202, a display area 2203, a keyboard 2204, an external connection port 2205, a pointing mouse 2206, and the like. The present invention makes it possible to achieve a highly reliable laptop personal computer having a high-definition display area.

Figure 14C:
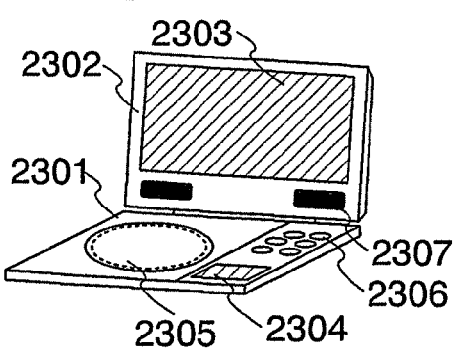

FIG. 14C is a portable image reproduction system (specifically, a DVD reproduction system) provided with a recording medium, which includes a main body 2401, a housing 2402, a display area A 2403, a display area B 2404, a recording medium (such as a DVD) reading portion 2405, an operation key 2406, a speaker portion 2407, and the like. The display area A 2403 mainly displays image information, while the display area B 2404 mainly displays character information. It is to be noted that the image reproduction system provided with a recording medium includes a home game machine. The present invention makes it possible to achieve a highly reliable image reproduction system having a high-definition display area.

Figure 14D:
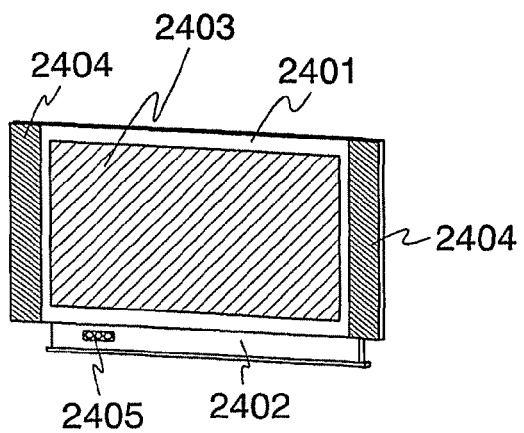

FIG. 14D is a display device, which includes a housing 2401, a support 2402, a display area 2403, a speaker 2404, a video input terminal 2405, and the like. This display device is manufactured using thin film transistors formed in accordance with the manufacturing method in the embodiment modes described above for the display area 2403 and a driver circuit. It is to be noted that the display device includes a liquid crystal display device and a light-emitting device, and specifically, includes all display devices for displaying information, such as for computers, for receiving televisions, and for displaying advertisements. The present invention makes it possible to achieve a highly reliable display device having a high-definition display area, in particular, a large display device having a large screen of 14 inches to 50 inches.

Figure 15:
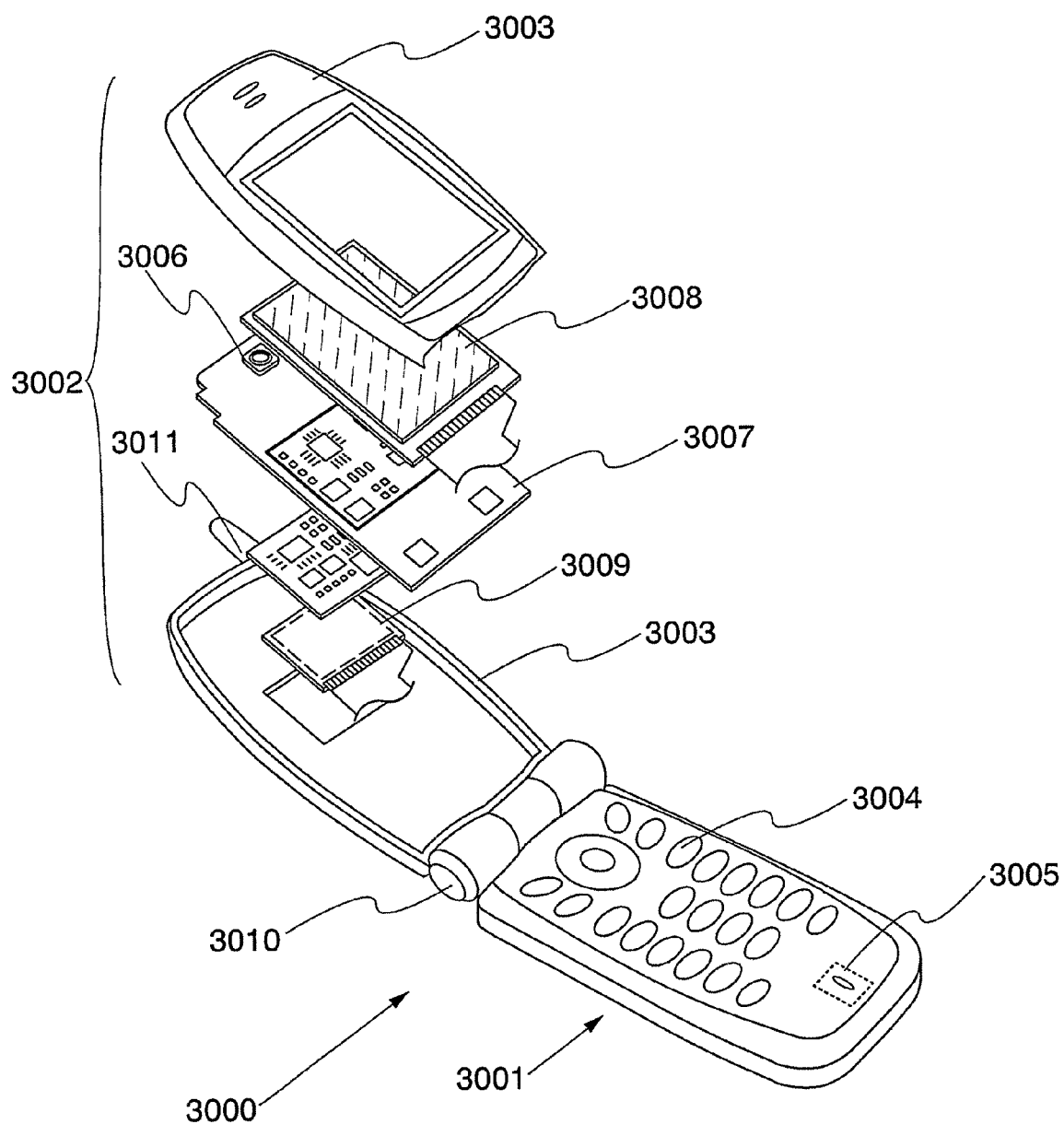
FIG. 15 is a figure illustrating an example of electronic devices.

The cellular phone shown in FIG. 15 has a main body (a) provided with operation switches 3004, a microphone 3005, and the like and a main body (b) provided with a display panel (a) 3008, a display panel (b) 3009, a speaker 3006, and the like, which are coupled with a hinge 3010 to be openable and closable. The display panel (a) 3008 and the display panel (b) 3009 are put in a housing 3003 of the main body (b) 3002 along with a circuit substrate 3007. Pixel areas of the display panel (a) 3008 and the display panel (b) 3009 are placed to be visible from an open window formed in the housing 3003.

The specifications of the display panel (a) 3008 and the display panel (b) 3009, such as the number of the pixels, can be appropriately set according to functions of the cellular phone 3000. For example, the display panel (a) 3008 and the display panel (b) 3009 can be combined as a main screen and a sub-screen, respectively.

Further, signals of image signals, audio signals, or the like are received with the antenna 3011; thus, display panel (b) 3008 may be operated as a display medium of a television receiver or the like.

The present invention makes it possible to achieve a highly reliable personal digital assistant having a high-definition display area.

The cellular phone according to this embodiment mode can be changed into various modes depending on the functions and applications thereof. For example, a cellular phone with a camera may be made by incorporating an image sensor into the portion of the hinge 3010. Also when the operation switches 3004, the display panel (a) 3008, and the display panel (b) 3009 are mounted in one housing, the effects described above can be achieved. Also when this embodiment mode is applied to a personal digital assistant provided with a plurality of display areas, similar effects can be obtained.

As described above, various electronic devices can be completed by practicing the present invention, namely, using the manufacturing method or structure in any one of Embodiment Modes 1 to 5.

Embodiment 1

In this embodiment, characteristics of TFTs were compared. One of the TFTs has a multigate structure of the present invention, specifically, a TFT (hereinafter, Type-A) having a semiconductor film which includes a source region, a drain region, a high concentration impurity region, a first channel region formed between the source region and the high concentration impurity region, and a second channel region having longer channel length than the first channel region and formed between the high concentration impurity region and the drain region. In the TFT of Type-A, a first gate electrode and a second gate electrode overlaps with the first channel region and the second channel region, respectively. The first and second electrodes are electrically connected to each other. Another of the TFTs is a TFT (hereinafter, Type-B) which is different from the TFT of Type-A in that the channel length of the first channel region and the second channel region are the same, however other structures are similar to the TFT of Type-A. The other of the TFTs is a TFT (hereinafter, Type-C) which is different from the TFT of Type-A in that the first channel region is shorter than the channel length of the second channel region, however other structures are similar to the TFT of Type-A.

As to multigate p-channel TFTs of the above Type-A, Type-B, and Type-C, parameters were set as described below, and dependence drain current on gate voltage was measured.

The TFT of Type-A had a multigate p-channel TFT, including two gate electrodes and two channel regions connected in series. A first channel region of the multigate TFT of Type-A had a channel length $L_1$ of 3.2 µm, while a second channel region thereof had a channel length $L_2$ of 1.5 µm.

The TFT of Type-B had a multigate p-channel TFT, including two gate electrodes and two channel regions connected in series. A first channel region of the multigate TFT of Type-B had a channel length $L_1$ of 2.4 µm, while a second channel region thereof had a channel length $L_2$ of 2.4 µM. Thus, the two channel regions had the same channel lengths.

The TFT of Type-C was a multigate p-channel TFT, including two gate electrodes and two channel regions connected in series. A first channel region of the multigate TFT of Type-C had a channel length $L_1$ of 1.5 µm, while a second channel region thereof had a channel length $L_2$ of 3.2 µm.

Other than the above, gate insulating films, channel regions, and drain voltage were set as follows as common parameters in the above TFTs of Type-A to Type-C. The gate insulating film was a silicon oxide film and the film thickness was 110 nm, while a silicon film was used for each of the first channel region and the second channel region with a channel width (W) of 23.7 µm at a drain voltage (Vd) of −12 V.

Figure 16:
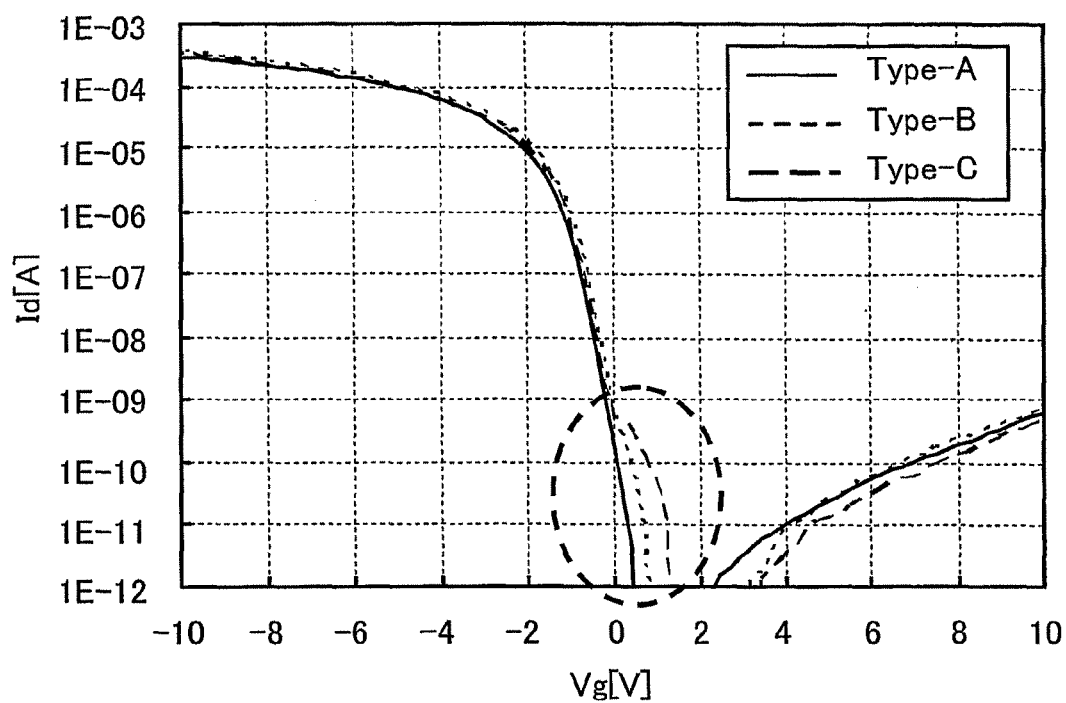
FIG. 16 is a diagram illustrating an example of dependence of drain current on gate voltage.

In FIG. 16, as to the TFTs having a multigate structure of Type-A, Type-B, and Type-C, dependence of drain current on gate voltage was measured. Hereinafter, the obtained drain current (Id)-gate voltage (Vg) characteristics are referred to as an Id-Vg curve.

In FIG. 16, knot-like characteristic defects were generated in a rising portion, enclosed by dashed line, of the Id-Vg curve of the TFTs of Type-B and Type-C. Meanwhile, in the TFT having a multigate structure of Type-A of the present invention, knot-like characteristic defects were not generated in a rising portion of the Id-Vg curve compared to the TFTs having a multigate structure of Type-B and Type-C.

The present inventors, through active investigation, found the reason for the generation of knot-like characteristic defects in a rising portion of the Id-Vg curve. Further, it was found that the TFT having a multigate structure of Type-A of the present invention prevents characteristic defects; specifically, knot-like characteristic defects generated in a rising portion of an Id-Vg curve. Hereinafter, the reason that knot-like characteristic defects are generated will be described using the TFT having a multigate structure of Type-B.

In the TFT having a multigate structure of Type-B, as described above, the channel length of the first channel region and the channel length of the second channel region are the same. Further, in the following description, as to a TFT having a multigate structure, a part of a TFT having a first channel region is equated with a first TFT 201 and a TFT having a second channel region is equated with a second TFT 202. Note that, electric potential of a high concentration impurity region which serves as drain region with respect to the first TFT and serves as source region with respect to the second TFT 202, is named as middle potential (VM).

FIG. 17A illustrates a case of applying gate voltage of (Vg)=+2 V. In this case, current does not flow in either TFT. However, OFF-state current flows in the second TFT 202.

FIG. 17B illustrates a case of applying Vg=+1 V. In this case, current begins to flow in the first TFT due to a short channel effect. Accordingly, the middle potential (VM) changes, and difference between the electric potentials of the source region and the drain region of the second TFT 202 (an absolute value of Vd−VM: hereinafter represented as |Vd−VM|) is increased. Further, OFF-state current also flows in the second TFT as in FIG. 17A.

FIG. 17C illustrates a case of applying Vg=+0.75 V. In this case, as in FIG. 17B, current flows in the first TFT 201 due to a short channel effect. Further, Vgs (=Vg−VM) of the second TNT 202 is increased, and the voltage (|Vd−VM|) applied between the source region and the drain region, the OFF-state current flowing in the second TFT 202 is increased. In this case, if relation between current flowing in the first TFT due to a short channel effect and the OFF-state current which flows in the second TFT 202 satisfies a certain condition, the drain current flows in a position where it does not flow originally. Accordingly, knot-like characteristic defects are generated in a rising portion of the Id-Vg curve.

FIG. 17D illustrates a case of applying Vg=+0.5 V. In this case, current flows in the second TFT 202 due to a short channel effect as with the first TFT 201.

FIG. 17E illustrates a case of applying Vg=0 V. In this case, current flows in the first TFT 201 in a linear region of the drain voltage (Vd)-drain current (Id) characteristics. Further, current flows in the second TFT in a saturation region of Vd-Id characteristics.

Thus, it is found that when short channel effect is promoted in each of the first TFT 201 and the second TFT 202 forming a TFT having a multigate structure, drain current flows in a position where it originally does not flow because current which begins to flow in the TFT 201 due to increasing short channel effect, and OFF-state current which flows in the second TFT 202 are balanced. It is found that thus knot-like characteristic defects are generated in a rising portion of the Id-Vg curve.

In the TFT having a multigate structure of Type-A, the channel length of the first channel region is longer than the channel length of the second channel region; thus, current can be prevented from flowing in the TFT on the source side due to a short channel effect. Accordingly, drain current can be prevented from flowing due to OFF-state current flows in the second TFT 202 shown in FIGS. 17B and 17C in a position where it originally does not flow. Thus, the defects of a rising portion of the Id-Vg curve can be prevented and characteristic defects of the TFT can be prevented.

Embodiment 2

In FIG. 10, a fourth interlayer insulating film 700 formed with a thin inorganic insulating film is provided so as to cover the electrode 529 and a part of the top surface of the electrode 529 is connected to a first electrode 541; however, the structure is not limited thereto, and a connection structure in which an end surface of the electrode and the first electrode 541 are in contact with each other may be employed.

Figure 18A:
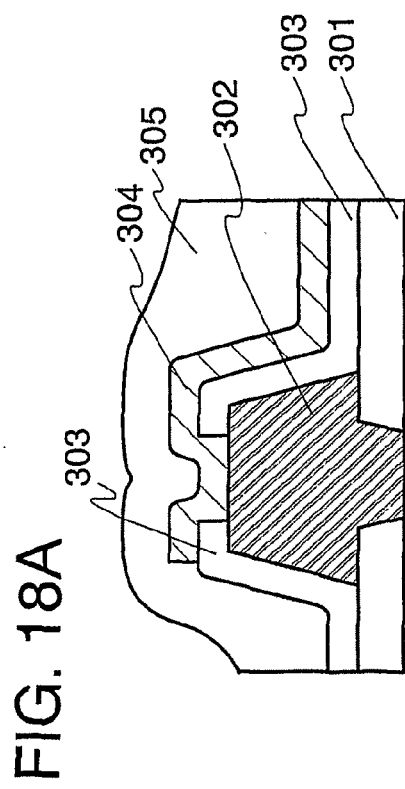
FIGS. 18A and 18B are respectively a cross-sectional schematic view and a STEM micrograph of a portion where a first electrode and a wiring of a light emitting element are connected.
Figure 18B:
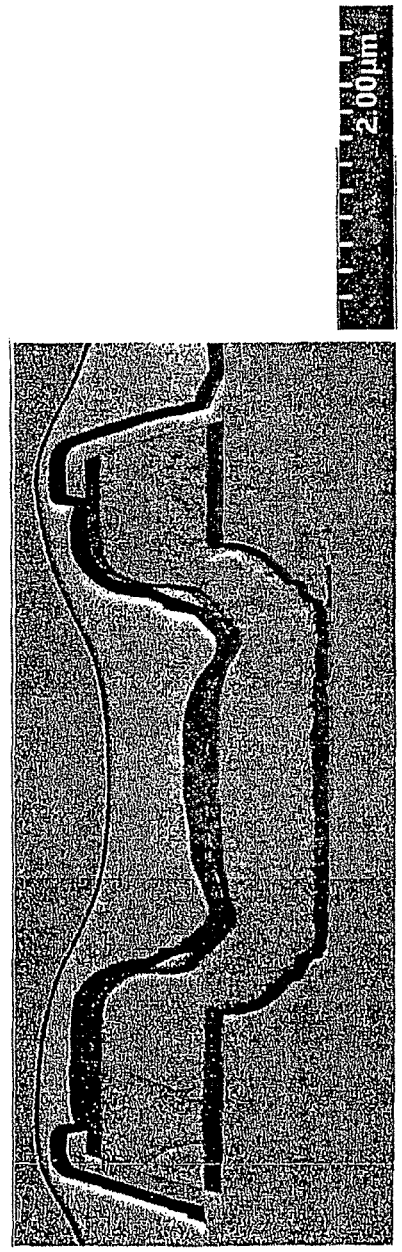

In order to examine electrical connection between the electrode 529 and the first electrode 541, after a TEG having almost the same layered structure as the layered structure referred to in the paragraph 250 was manufactured, electrical connection was examined by an electric measurement, and a cross-sectional STEM micrograph of around the connection area was taken. FIGS. 18A and 18B show a schematic view and the cross sectional TEM photograph, respectively.

As, shown in FIG. 18A, an opening is formed in the first interlayer insulating film 301 and a wiring 302 is formed thereover. Although not shown in the schematic view, the wiring 302 is connected to the semiconductor layer through the opening in the first interlayer insulating film 301. The wiring 302 is shown as a single layer in FIG. 18A for simplification, while the wiring 302 shown in FIG. 18A has a three-layered structure of a titanium film, an aluminum film, and a titanium film. A second interlayer insulating film 303 is formed to a thickness of 150 nm so as to cover an end surface of the wiring 302, another opening is formed in the second interlayer insulating film 303 so as to overlap with the opening of the first interlayer insulating film 301. A first electrode 304 is formed through the opening of the second interlayer insulating film 303, an organic resin film 305 to be a partition layer is formed so as to cover the first electrode and the second interlayer insulating film. Since the thickness of the organic resin film 305 which is formed by spin coating method is set at 1 μm; thus, the thickness of the organic resin film above an end face of the wiring is less than 1 μm. Note that any insulating film can be used for the organic resin film 305 as long as it is formed by a coating method such as spin coating, and a film containing siloxane may be used.

Figure 19A:
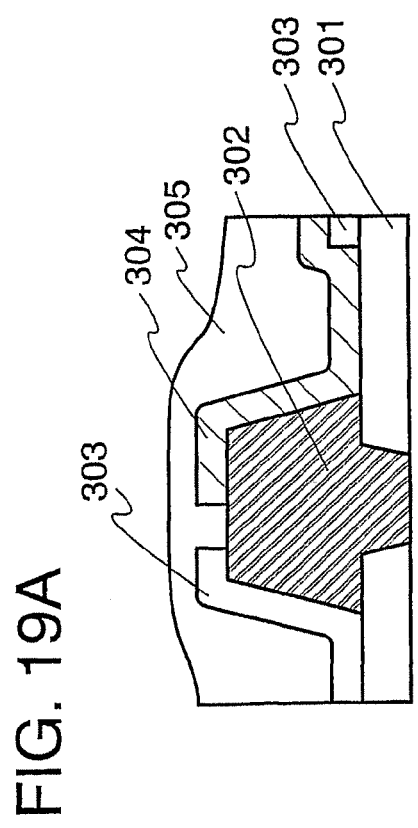
FIGS. 19A and 19B are respectively a cross-sectional schematic view and a STEM micrograph of a portion where a first electrode and a wiring of a light emitting element are connected.
Figure 19B:
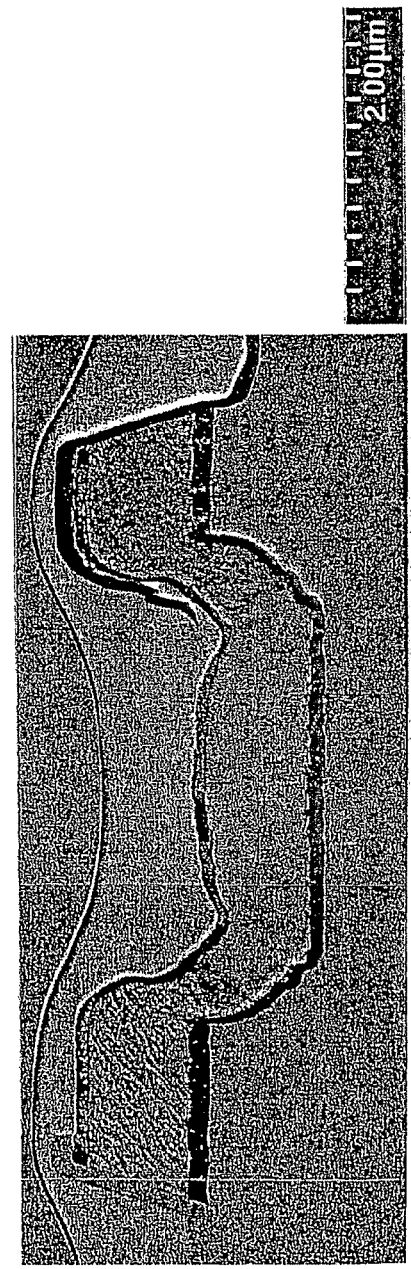

Further, FIG. 19A illustrates an example of manufacturing a TEG having a connection structure that is different from FIG. 18A. FIG. 19A shows a cross-sectional schematic view, and FIG. 19B shows the cross-sectional STEM micrograph. Note that, parts which are the same as FIG. 18A are denoted by the same reference numerals. The structure shown in FIG. 19A is a structure in which reduction in the film thickness above an end face of the wiring is reduced. In an area where the first electrode 304 and the wiring 302 are in contact with each other, since the second interlayer insulating film is not formed, the thickness of the organic resin film can be thicker than in the structure shown in FIG. 18A. Accordingly, in the structure of FIG. 19A, there is an area where the first interlayer insulating film is in contact with the first electrode.

Figure 20A:
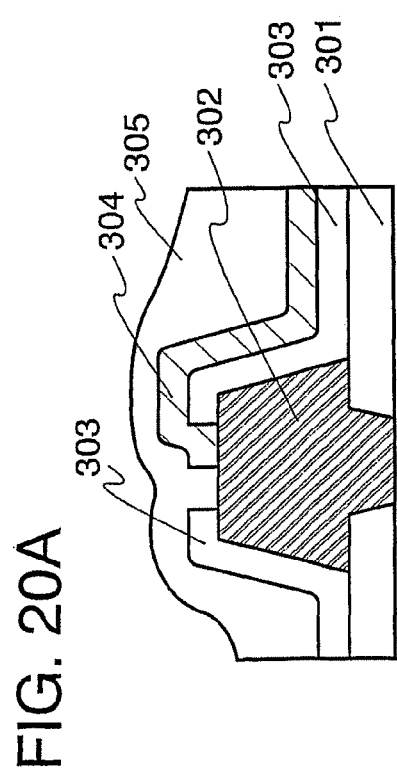
FIGS. 20A and 20B are respectively a cross-sectional schematic view and a STEM micrograph of a portion where a first electrode and a wiring of a light emitting element are connected.
Figure 20B:
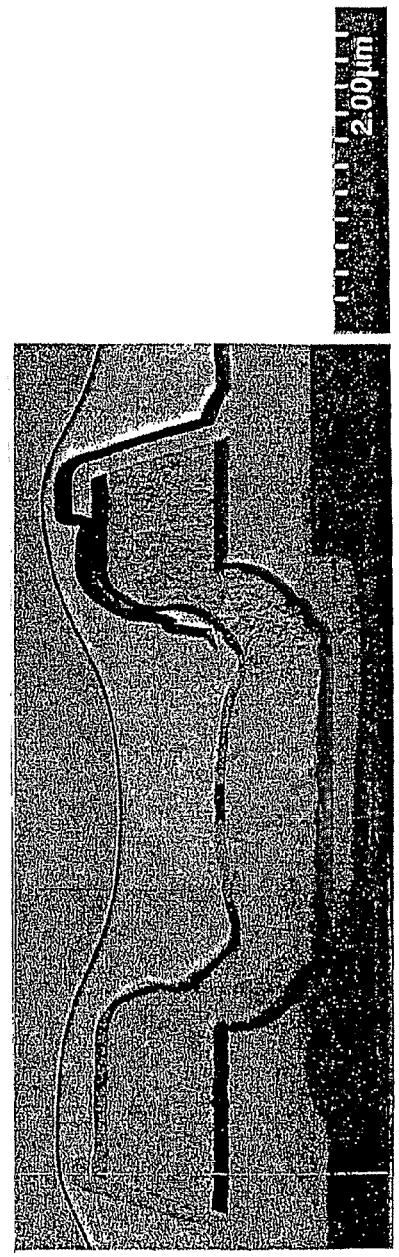

Further, FIG. 20A illustrates an example of manufacturing a LEG having a different connection structure from FIG. 18A and FIG. 19A. FIG. 20A shows a cross-sectional schematic view and FIG. 20B shows a cross-sectional STEM micrograph. Note that, parts which are the same as in FIG. 18A are denoted by the same reference numerals. The structure of FIG. 20A is an example where an end face of the first electrode 304 is placed inside the opening of the interlayer insulating film. Accordingly, in the structure in FIG. 20A, the interface between the wiring and the first electrode is exposed in etching for forming the first electrode. In this structure, etching is easily promoted at an interface, that is, an interface between a titanium film and an ITSO film, so that it can be observed that an end portion of the first electrode is inversely tapered in the cross-sectional photograph in FIG. 20B. In other words, in the case of manufacturing the structure in FIG. 20A, the first electrode is easily etched excessively, so that the first electrode overlapping with the wiring is eliminated, and electrical connection may be difficult to be made. Therefore, connection structure of FIG. 18A is preferred to the connection structure of FIG. 20A in view of the manufacturing process.

Note that electrical connection was confirmed in each of the structures of FIG. 19A, and FIG. 20A as in the structure of FIG. 18A; therefore, the result of this experiment indicates that any one of the structures man be used.

This application is based on Japanese Patent Application serial No. 2005-212200 filed in Japan Patent Office on Jul. 22, 2005, the entire contents of which are hereby incorporated by reference.

What is claimed is:

1. A light emitting device comprising:
   a semiconductor layer comprising a first channel region and a second channel region;
   an insulating film over the semiconductor layer;
   a first gate electrode over the semiconductor layer, the first gate electrode overlapping the first channel region;
   a second gate electrode over the semiconductor layer, the second gate electrode overlapping the second channel region; and
   a light emitting element electrically connected to the first channel region through the second channel region,
   wherein the first gate electrode comprises a first layer and a second layer, wherein the second layer is provided over the first layer,
wherein the second layer is narrower than the first layer in a cross section, and
wherein a channel length of the first channel region is longer than a channel length of the second channel region.

2. The light emitting device according to claim 1, wherein the first gate electrode is electrically connected to the second gate electrode.

3. The light emitting device according to claim 1, wherein the first channel region, the second channel region, the first gate electrode, and the second gate electrode are included in a transistor having a multigate structure.

4. The light emitting device according to claim 1, wherein the light emitting element comprises a layer containing an organic compound.

5. The light emitting device according to claim 1, further comprising an impurity region between the first channel region and the second channel region.

6. The light emitting device according to claim 1, wherein the channel length of the first channel region $L_1$ and the channel length of the second channel region $L_2$ are satisfies a relational expression, $3 \times L_1 \geq 5 \times L_2$.

7. An electronic device comprising the light emitting device according to claim 1.

8. A light emitting device comprising:
a semiconductor comprising a first channel region and a second channel region;
an insulating film over the semiconductor;
a first gate electrode over the semiconductor, the first gate electrode overlapping the first channel region;
a second gate electrode over the semiconductor, the second gate electrode overlapping the second channel region; and
a light emitting element electrically connected to the first channel region,
wherein the first gate electrode comprises a first layer and a second layer,
wherein the second layer is provided over the first layer,
wherein the second layer is narrower than the first layer in a cross section, and
wherein a channel length of the first channel region is longer than a channel length of the second channel region.

9. The light emitting device according to claim 8, wherein the first gate electrode is electrically connected to the second gate electrode.

10. The light emitting device according to claim 8, wherein the first channel region, the second channel region, the first gate electrode, and the second gate electrode are included in a transistor having a multigate structure.

11. The light emitting device according to claim 8, wherein the light emitting element comprises a layer containing an organic compound.

12. The light emitting device according to claim 8, further comprising an impurity region between the first channel region and the second channel region.

13. The light emitting device according to claim 8, wherein the channel length of the first channel region $L_1$ and the channel length of the second channel region $L_2$ are satisfies a relational expression, $3 \times L_1 \geq 5 \times L_2$.

14. An electronic device comprising the light emitting device according to claim 8.

15. A light emitting device comprising:
a semiconductor layer comprising a first channel region and a second channel region;
an insulating film over the semiconductor layer;
a first gate electrode over the semiconductor layer, the first gate electrode overlapping the first channel region;
a second gate electrode over the semiconductor layer, the second gate electrode overlapping the second channel region;
a light emitting element electrically connected to the first channel region through the second channel region;
a first wiring electrically connected to the semiconductor layer; and
a second wiring comprising the same material as the first wiring,
wherein the first gate electrode comprises a first layer and a second layer,
wherein the second layer is provided over the first layer,
wherein the second layer is narrower than the first layer in a cross section,
wherein the first wiring and the second wiring are provided in a same layer,
wherein the second wiring extends in a direction along the first wiring, and
wherein a channel length of the first channel region is longer than a channel length of the second channel region.

16. The light emitting device according to claim 15, wherein the first gate electrode is electrically connected to the second gate electrode.

17. The light emitting device according to claim 15, wherein the first channel region, the second channel region, the first gate electrode, and the second gate electrode are included in a transistor having a multigate structure.

18. The light emitting device according to claim 15, wherein the light emitting element comprises a layer containing an organic compound.

19. The light emitting device according to claim 15, further comprising an impurity region between the first channel region and the second channel region.

20. The light emitting device according to claim 15, wherein the channel length of the first channel region $L_1$ and the channel length of the second channel region $L_2$ are satisfies a relational expression, $3 \times L_1 \geq 5 \times L_2$.

21. An electronic device comprising the light emitting device according to claim 15.

* * * * *